(12) United States Patent
O'Brien et al.

(10) Patent No.: US 7,985,446 B2
(45) Date of Patent: *Jul. 26, 2011

(54) PREPARATION OF NANOPARTICLE MATERIALS

(75) Inventors: Paul O'Brien, High Peak (GB); Nigel Pickett, East Croydon (GB)

(73) Assignee: Nanoco Technologies Limited, Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 12/854,601

(22) Filed: Aug. 11, 2010

(65) Prior Publication Data

US 2011/0070147 A1 Mar. 24, 2011

Related U.S. Application Data

(63) Continuation of application No. 11/579,050, filed as application No. PCT/GB2005/001611 on Apr. 27, 2005, now Pat. No. 7,803,423.

(30) Foreign Application Priority Data

Apr. 30, 2004 (GB) .................................. 0409877.8

(51) Int. Cl.
*B82B 3/00* (2006.01)
*C01B 7/00* (2006.01)
*C30B 7/00* (2006.01)
*C30B 7/14* (2006.01)

(52) U.S. Cl. ...................... 427/214; 427/212; 427/213.3; 427/213.31; 427/213.34; 427/215; 427/220; 428/402; 428/403

(58) Field of Classification Search ................... 427/212, 427/214
See application file for complete search history.

(56) References Cited

U.S. PATENT DOCUMENTS

| 2,769,838 | A | 11/1956 | Matter et al. |
|---|---|---|---|
| 3,524,771 | A | 8/1970 | Green |
| 4,609,689 | A | 9/1986 | Schwartz et al. |
| 6,114,038 | A | 9/2000 | Castro et al. |
| 6,207,229 | B1 | 3/2001 | Bawendi et al. |
| 6,221,602 | B1 | 4/2001 | Barbera-guillem et al. |
| 6,261,779 | B1 | 7/2001 | Barbera-guillem et al. |
| 6,322,901 | B1 | 11/2001 | Bawendi et al. |
| 6,326,144 | B1 | 12/2001 | Bawendi et al. |

(Continued)

FOREIGN PATENT DOCUMENTS

CN 1394599 2/2003

(Continued)

OTHER PUBLICATIONS

Richardson et al., Chemical Engineering: Chemical and Biochemical Reactors and Process Control, vol. 3, Third Edition, Butterworth-Heinemann, (1994), pp. 3-5.*

(Continued)

*Primary Examiner* — Michael Cleveland
*Assistant Examiner* — Lisha Jiang
(74) *Attorney, Agent, or Firm* — Bingham McCutchen LLP

(57) ABSTRACT

A method of producing nanoparticles comprises effecting conversion of a nanoparticle precursor composition to the material of the nanoparticles. The precursor composition comprises a first precursor species containing a first ion to be incorporated into the growing nanoparticles and a separate second precursor species containing a second ion to be incorporated into the growing nanoparticles. The conversion is effected in the presence of a molecular cluster compound under conditions permitting seeding and growth of the nanoparticles.

24 Claims, 18 Drawing Sheets

U.S. PATENT DOCUMENTS

Figure 1:
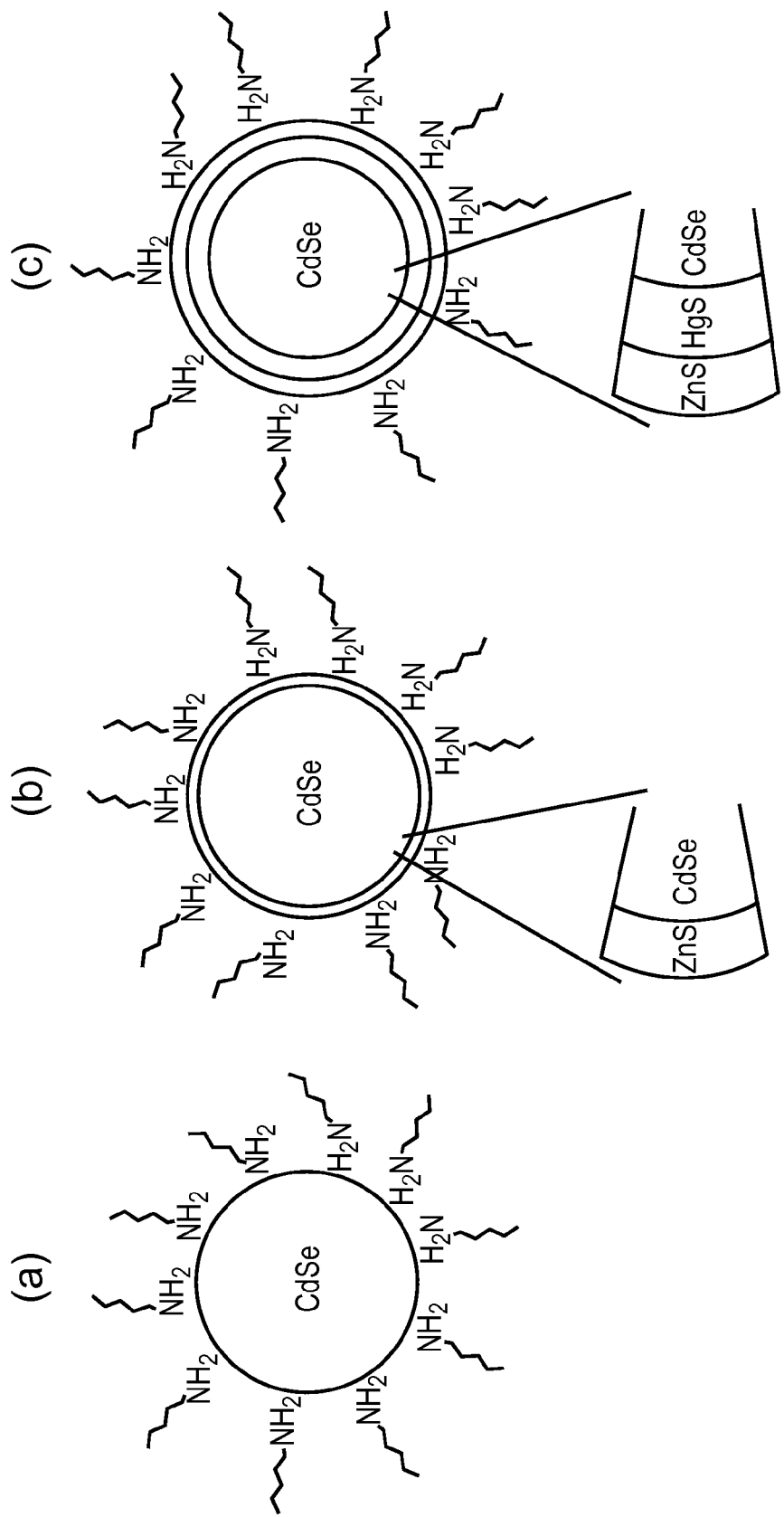

| | | | |
|---|---|---|---|
| 6,333,110 | B1 | 12/2001 | Barbera-guillem |
| 6,379,635 | B2 | 4/2002 | O'Brien et al. |
| 6,423,551 | B1 | 7/2002 | Weiss et al. |
| 6,426,513 | B1 | 7/2002 | Bawendi et al. |
| 6,607,829 | B1 | 8/2003 | Bawendi et al. |
| 6,660,379 | B1 | 12/2003 | Lakowicz et al. |
| 6,699,723 | B1 | 3/2004 | Weiss et al. |
| 6,815,064 | B2 | 11/2004 | Treadway et al. |
| 6,855,551 | B2 | 2/2005 | Bawendi et al. |
| 6,914,264 | B2 | 7/2005 | Chen et al. |
| 6,992,202 | B1 | 1/2006 | Banger et al. |
| 7,151,047 | B2 | 12/2006 | Chan et al. |
| 7,235,361 | B2 | 6/2007 | Bawendi et al. |
| 7,264,527 | B2 | 9/2007 | Bawendi et al. |
| 7,544,725 | B2 | 6/2009 | Pickett et al. |
| 7,588,828 | B2 | 9/2009 | Mushtaq et al. |
| 7,674,844 | B2 | 3/2010 | Pickett et al. |
| 7,803,423 | B2 * | 9/2010 | O'Brien et al. .......... 427/213.34 |
| 7,867,556 | B2 * | 1/2011 | Pickett .......... 427/214 |
| 7,867,557 | B2 * | 1/2011 | Pickett et al. .......... 427/214 |
| 2003/0017264 | A1 | 1/2003 | Treadway et al. |
| 2003/0106488 | A1 | 6/2003 | Huang et al. |
| 2003/0148024 | A1 | 8/2003 | Kodas et al. |
| 2004/0007169 | A1 | 1/2004 | Ohtsu et al. |
| 2004/0036130 | A1 | 2/2004 | Lee et al. |
| 2004/0110002 | A1 | 6/2004 | Kim et al. |
| 2004/0110347 | A1 | 6/2004 | Yamashita |
| 2004/0178390 | A1 | 9/2004 | Whiteford et al. |
| 2004/0250745 | A1 | 12/2004 | Ogura et al. |
| 2005/0098204 | A1 | 5/2005 | Roscheisen et al. |
| 2005/0129947 | A1 | 6/2005 | Peng et al. |
| 2005/0145853 | A1 | 7/2005 | Sato et al. |
| 2006/0019098 | A1 | 1/2006 | Chan et al. |
| 2006/0057382 | A1 | 3/2006 | Treadway et al. |
| 2006/0061017 | A1 | 3/2006 | Strouse et al. |
| 2006/0068154 | A1 | 3/2006 | Parce et al. |
| 2006/0110279 | A1 | 5/2006 | Han et al. |
| 2006/0118757 | A1 | 6/2006 | Klimov et al. |
| 2006/0130741 | A1 | 6/2006 | Peng et al. |
| 2007/0012941 | A1 | 1/2007 | Cheon |
| 2007/0034833 | A1 | 2/2007 | Parce et al. |
| 2007/0059705 | A1 | 3/2007 | Lu et al. |
| 2007/0104865 | A1 | 5/2007 | Pickett |
| 2007/0110816 | A1 | 5/2007 | Jun et al. |
| 2007/0114520 | A1 | 5/2007 | Garditz et al. |
| 2007/0125983 | A1 | 6/2007 | Treadway et al. |
| 2007/0131905 | A1 | 6/2007 | Sato et al. |
| 2007/0199109 | A1 | 8/2007 | Yi et al. |
| 2007/0202333 | A1 | 8/2007 | O'Brien et al. |
| 2007/0238126 | A1 | 10/2007 | Pickett et al. |
| 2008/0107911 | A1 | 5/2008 | Liu et al. |
| 2008/0112877 | A1 | 5/2008 | Xiao et al. |
| 2008/0121844 | A1 | 5/2008 | Jang et al. |
| 2008/0160306 | A1 | 7/2008 | Mushtaq et al. |
| 2008/0190483 | A1 | 8/2008 | Carpenter et al. |
| 2008/0220593 | A1 | 9/2008 | Pickett et al. |
| 2008/0257201 | A1 | 10/2008 | Harris et al. |
| 2008/0264479 | A1 | 10/2008 | Harris et al. |
| 2009/0139574 | A1 | 6/2009 | Pickett et al. |
| 2009/0212258 | A1 | 8/2009 | Mccairn et al. |
| 2009/0263816 | A1 | 10/2009 | Pickett et al. |
| 2010/0059721 | A1 | 3/2010 | Pickett et al. |
| 2010/0068522 | A1 | 3/2010 | Pickett et al. |
| 2010/0113813 | A1 | 5/2010 | Pickett et al. |
| 2010/0123155 | A1 | 5/2010 | Pickett et al. |
| 2010/0193767 | A1 | 8/2010 | Naasani et al. |
| 2010/0212544 | A1 | 8/2010 | Harris et al. |

FOREIGN PATENT DOCUMENTS

| | | |
|---|---|---|
| EP | 1176646 | 1/2002 |
| EP | 1783137 | 5/2007 |
| EP | 1854792 | 11/2007 |
| GB | 9518910.6 | 9/1995 |
| GB | 2429838 | 3/2007 |
| JP | 2005/139389 | 6/2005 |
| WO | WO-97/10175 | 3/1997 |
| WO | WO-00/17642 | 3/2000 |
| WO | WO-02/04527 | 1/2002 |
| WO | WO-02/24623 | 3/2002 |
| WO | WO-02/29140 | 4/2002 |
| WO | WO-03/099708 | 12/2003 |
| WO | WO-2004/008550 | 1/2004 |
| WO | WO-2004/033366 | 4/2004 |
| WO | WO-2004/065362 | 8/2004 |
| WO | WO-2004/066361 | 8/2004 |
| WO | WO-2005/021150 | 3/2005 |
| WO | WO-2005/106082 | 11/2005 |
| WO | WO-2005/123575 | 12/2005 |
| WO | WO-2006/001848 | 1/2006 |
| WO | WO-2006/017125 | 2/2006 |
| WO | WO-2006/075974 | 7/2006 |
| WO | WO-2006/116337 | 11/2006 |
| WO | WO-2006/118543 | 11/2006 |
| WO | WO-2006/134599 | 12/2006 |
| WO | WO-2007/020416 | 2/2007 |
| WO | WO-2007/049052 | 5/2007 |
| WO | WO-2007/060591 | 5/2007 |
| WO | WO-2007/065039 | 6/2007 |
| WO | WO-2007/098378 | 8/2007 |
| WO | WO-2007/102799 | 9/2007 |
| WO | WO-2008/013780 | 1/2008 |
| WO | WO-2008/054874 | 5/2008 |
| WO | WO-2008/133660 | 11/2008 |
| WO | WO-2009/016354 | 2/2009 |
| WO | WO-2009/040553 | 4/2009 |
| WO | WO-2009/106810 | 9/2009 |

OTHER PUBLICATIONS

Cumberland et al., "Inorganic Clusters as Single-Source Precursors for Preparation of CdSe, ZnSe, and CdSe/ZnS Nanomaterials", Chemistry of Materials (2002), pp. 1576-1584.*

Agger, J.R. et al., J. Phys. Chem. B (1998) 102, p. 3345.

Aldana, J. et al. "Photochemical Instability of CdSe Nanocrystals Coated by Hydrophilic Thiols", J. Am. Chem. Soc. (2001), 123: 8844-8850.

Alivisatos, A.P. "Perspectives on the Physical Chemistry of Semiconductor Nanocrystals", J. Phys. Chem., (1996), 100, pp. 13226-13239.

Arici et al., Thin Solid Films 451-452 (2004) 612-618.

Battaglia et al., "Colloidal Two-dimensional Systems: CdSe Quantum Shells and Wells," Angew Chem. (2003) 115:5189.

Bawendi, M.G. The Quantum Mechanics of Larger Semiconductor Clusters ("Quantum Dots"), Annu. Rev. Phys. Chem. (1990), 42: 477-498.

Berry, C.R. "Structure and Optical Absorption of AgI Microcrystals", Phys. Rev. (1967) 161: 848-851.

Bunge, S.D. et al. "Growth and morphology of cadmium chalcogenides: the synthesis of nanorods, tetrapods, and spheres from CdO and $Cd(O_2CCH_3)_2$", J. Mater. Chem. (2003) 13: 1705-1709.

Castro et al., Chem. Mater. (2003) 15:3142-3147.

Castro et al., "Synthesis and Characterization of Colloidal $CuInS_2$ Nanoparticles from a Molecular Single-Source Precursors," J. Phys. Chem. B (2004) 108:12429.

Chun et al., Thin Solid Films 480-481 (2005) 46-49.

Contreras et al., "ZnO/ZnS(O,OH)/Cu(In,Ga)$Se_2$/Mo Solar Cell with 18:6% Efficiency," from 3d World Conf. on Photovol. Energy Conv., Late News Paper, (2003) pp. 570-573.

Cui et al., "Harvest of near infrared light in PbSe nanocrystal-polymer hybrid photovoltaic cells," Appl. Physics Lett. 88 (2006) 183111-183111-3.

Cumberland et al., "Inorganic Clusters as Single-Source Precursors for Preparation of CdSe, ZnSe, and CdSe/ZnS Nanomaterials" Chemistry of Materials, 14, pp. 1576-1584, (2002).

Dance et al., J. Am. Chem. Soc. (1984) 106:6285.

Daniels et al., "New Zinc and Cadmium Chalcogenide Structured Nanoparticles," Mat. Res. Soc. Symp. Proc. 789 (2004).

Eychmüller, A. et al. "A quantum dot quantum well: CdS/HgS/CdS", Chem. Phys. Lett. 208, pp. 59-62 (1993).

Fendler, J.H. et al. "The Colloid Chemical Approach to Nanostructured Materials", Adv. Mater. (1995) 7: 607-632.

Gao, M. et al. "Synthesis of PbS Nanoparticles in Polymer Matrices", J. Chem. Soc. Commun. (1994) pp. 2779-2780.
Gou et al., J. Am. Chem. Soc. (2006) 128:7222-7229.
Gur et al., "Air stable all-inorganic nanocrystal solar cells processed from solution," Lawrence Berkeley Natl. Lab., Univ. of California, paper LBNL-58424 (2005).
Gurin, Colloids Surf. A (1998) 142:35-40.
Guzelian, A. et al. "Colloidal chemical synthesis and characterization of InAs nanocrystal quantum dots", Appl. Phys. Lett. (1996) 69: 1432-1434.
Guzelian, A. et al., J. Phys. Chem. (1996) 100: 7212.
Hagfeldt, A. et al. "Light-induced Redox Reactions in Nanocrystalline Systems", Chem. Rev. (1995) 95: 49-68.
Henglein, A. "Small-Particle Research: Physicochemical Properties of Extremely Small Colloidal Metal and Semiconductor Particles", Chem Rev. (1989) 89: 1861-1873.
Hirpo et al., "Synthesis of Mixed Copper-Indium Chalcogenolates. Single-Source Precursors for the Photovoltaic Materials CuInQ2 (Q=S, Se)," J. Am. Chem. Soc. (1993) 115:1597.
Hu et al., Sol. State Comm. (2002) 121:493-496.
International Search Report for PCT/GB2005/001611 mailed Sep. 8, 2005 (5 pages).
Jegier, J.A. et al. "Poly(imidogallane): Synthesis of a Crystalline 2-D Network Solid and Its Pyrolysis To Form Nanocrystalline Gallium Nitride in Supercritical Ammonia", Chem. Mater. (1998) 10: 2041-2043.
Jiang et al., Inorg. Chem. (2000) 39:2964-2965.
Kaelin et al., "CIS and CIGS layers from selenized nanoparticle precursors," Thin Solid Films 431-432 (2003) pp. 58-62.
Kapur et al., "Non-Vacuum processing of $CuIn_{1-x}Ga_xSe_2$ solar cells on rigid and flexible substrates using nanoparticle precursor inks," Thin Solid Films 431-432 (2003) pp. 53-57.
Kher, S. et al. "A Straightforward, New Method for the Synthesis of Nanocrystalline GaAs and GaP", Chem. Mater. (1994) 6: 2056-2062.
Kim et al., "Synthesis of CuInGaSe2 Nanoparticles by Low Temperature Colloidal Route," J. Mech. Sci. Tech., Vo. 19, No. 11, pp. 2085-2090 (2005).
Law et al., "Nanowire dye-sensitized solar cells," Nature Mater. (2005) vol. 4 pp. 455-459.
Li et al., Adv. Mat. (1999) 11:1456-1459.
Lieber, C. et al. "Understanding and Manipulating Inorganic Materials with Scanning Probe Microscopes", Angew. Chem. Int. Ed. Engl. (1996) 35: 687-704.
Little et al., "Formation of Quantum-dot quantum-well heteronanostructures with large lattice mismatch: Zn/CdS/ZnS," 114 J. Chem. Phys. 4 (2001).
Lu et al., Inorg. Chem. (2000) 39:1606-1607.
LØver, T. et al. "Preparation of a novel CdS nanocluster material from a thiophenolate-capped CdS cluster by chemical removal of SPh ligands", J. Mater. Chem. (1997) 7(4): 647-651.
Malik et al., Adv. Mat., (1999) 11:1441-1444.
Matijevic, E., "Monodispersed Colloids: Art and Science", Langmuir (1986) 2:12-20.
Matijevic, E. "Production of Mondispersed Colloidal Particles", Ann. Rev. Mater. Sci. (1985) 15: 483-518.
Mekis, I. et al., "One-Pot Synthesis of Highly Luminescent CdSe/CdS Core-Shell Nanocrystals via Organometallic and "Greener" Chemical Approaches", J. Phys. Chem. B. (2003) 107: 7454-7462.
Mews et al., J. Phys. Chem. (1994) 98:934.
Micic et al., "Synthesis and Characterization of InP, GaP, and $GaInP_2$ Quantum Dots", J. Phys. Chem. (1995) pp. 7754-7759.
Milliron et al., "Electroactive Surfactant Designed to Mediate Electron Transfer between CdSe Nanocrystals and Organic Semiconductors," Adv. Materials (2003) 15, No. 1, pp. 58-61.
Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.
Nairn et al., Nano Letters (2006) 6:1218-1223.
Nazeeruddin et al., "Conversion of Light to Electricity by cis-X2Bis(2,2'bipyridyl-4,4'-dicarboxylate)ruthenium(II) Charge-Transfer Sensitizers (X=Cl-, Br-, I-, CN-, and SCN-) on Nanocrystalline $TiO_2$ Electrodes," J. Am. Chem. Soc. (1993) 115:6382-6390.

Nazeeruddin et al., "Engineering of Efficient Panchromatic Sensitizers for Nanocrystalline TiO2-Based Solar Cells," J. Am. Chem. Soc. (2001) 123:1613-1624.
O'Brien et al., "The Growth of Indium Selenide Thin Films from a Novel Asymmetric Dialkydiselenocarbamate," 3 Chem. Vap. Depos. 4, pp. 227 (1979).
Olshavsky, M.A., et al. "Organometallic Synthesis of GaAs Crystallites Exhibiting Quantum Confinement", J. Am. Chem. Soc. (1990) 112: 9438-9439.
Olson et al., J. Phys. Chem. C. (2007) 111:16640-16645.
Patents Act 1977: Search Report under Section 17 for Application No. GB0409877.8 dated Oct. 7, 2004 (2 pages).
Patent Act 1977 Search Report under Section 17 for Application No. GB0522027.2 dated Jan. 27, 2006 (1 page).
Patent Act 1977 Search Report under Section 17 for Application No. GB0606845.6 dated Sep. 14, 2006.
Patent Act 1977 Search Report under Section 17 for Application No. GB0719073.9 dated Feb. 29, 2008.
Patent Act 1977 Search Report under Section 17 for Application No. GB0719075.4 dated Jan. 22, 2008.
Patent Act 1977 Search Report under Section 17 for Application No. GB0723539.3 dated Mar. 27, 2008 (1 page).
Peng et al., "Mechanisms of the Shape Evolution of CdSe Nanocrystals", J. Am. Chem. Soc. (2001) 123:1389.
Peng et al., "Kinetics of I-VI and III-V Colloidal Semiconductor Nanocrystal Growth: "Focusing" os Size Distributions", J. Am. Chem. Soc., (1998) 129: 5343-5344.
Peng et al., "Shape control of CdSe nanocrystals", Nature, (2000) vol. 404, No. 6773, pp. 59-61.
Pradhan, N. et al. "Single-Precursor, One-Pot Versatile Synthesis under near Ambient Conditions of Tunable, Single and Dual Band Flourescing Metal Sulfide Nanoparticles", J. Am. Chem. Soc. (2003) 125: 2050-2051.
Qi et al., "Efficient polymer-nanocrystal quantum-dot photodetectors," Appl. Physics Lett. 86 (2005) 093103-093103-3.
Qu, L. et al. "Alternative Routes toward High Quality CdSe Nanocrystals", Nano Lett. (2001) vol. 1, No. 6, pp. 333-337.
Robel et al., "Quantum Dot Solar Cells. Harvesting Light Energy with CdSe Nanocrystals Molecularly Linked to Mesoscopic TiO2 Films," J. Am. Chem. Soc. (2006) 128: 2385-2393.
Salata, O.V. et al. "Uniform GaAs quantum dots in a polymer matrix", Appl. Phys. Letters (1994) 65(2): 189-191.
Sercel, P.C. et al. "Nanometer-scale GaAs clusters from organometallic percursors", Appl. Phys. Letters (1992) 61: 696-698.
Shulz et al., J. Elect. Mat. (1998) 27:433-437.
Steigerwald, M.L. et al. "Semiconductor Crystallites: A Class of Large Molecules", Acc. Chem. Res. (1990) 23: 183-188.
Stroscio, J.A. et al. "Atomic and Molecular Manipulation with the Scanning Tunneling Microscope", Science (1991), 254: 1319-1326.
Trinidade et al., "A Single Source Spproach to the Synthesis of CdSe Nanocrystallites", Advanced Materials, (1996) vol. 8, No. 2, pp. 161-163.
Vayssieres et al., "Highly Ordered $SnO_2$ Nanorod Arrays from Controlled Aqueous Growth," Angew. Chem. Int. Ed. (2004) 43: 3666-3670.
Wang Y. et al. "PbS in polymers, From molecules to bulk solids", J. Chem. Phys. (1987) 87: 7315-7322.
Weller, H. "Colloidal Semiconductor Q-Particles: Chemistry in the Transition Region Between Solid State and Molecules", Angew. Chem. Int. Ed. Engl. (1993) 32: 41-53.
Weller, H. "Quantized Semiconductor Particles: A Novel State of Mater for Materials Science", Adv. Mater. (1993) 5: 88-95.
Wells, R.L. et al. "Synthesis of Nanocrystalline Indium Arsenide and Indium Phosphide from Indium(III) Halides and Tris(trimethylsilyl)pnicogens. Synthesis, Characterization, and Decomposition Behavior of $I_3In$—$P(SiMe_3)_3$", Chem. Mater. (1995) 7: 793-800.
Xiao et al., J. Mater. Chem. (2001) 11:1417-1420.
Yang et al., Crystal Growth & Design (2007) 12:2562-2567.
Yu et al., "Polymer Photovoltaic Cells: Enhanced Efficiencies via a Network of Internal Donor-Acceptor Heterojunctions," 270 Science 5243 (1995), pp. 1789-1791.
Zhong et al., Nanotechnology 18 (2007) 025602.

Barron, "Group III Materials: New Phases and Nono-particles with Applications in Electronics and Optoelectronics," Office of Naval Research Final Report (1999).

Dabousi et al., "(CdSe)ZnS Core-Shell Quantum Dots: Synthesis and Characterization of a Size Series of Highly Luminescent Nanocrystallites," Jrl. Phys. Chem.,(1997) 101, pp. 9463-9475.

Dehnen et al., "Chalcogen-Bridged Copper Clusters," Eur. J. Inorg. Chem., (2002) pp. 279-317.

Eisenmann et al., "New Phosphido-bridged Multinuclear Complexes of Ag and Zn," Zeitschrift fur anorganische and allgemeine Chemi (1995). (1 page—abstract).

Müller et al., "From Giant Molecular Clusters and Precursors to Solid-state Structures," Current Opinion in Solid State and Materials Science, 4 (Apr. 1999) pp. 141-153.

Timoshkin, "Group 13 imido metallanes and their heavier analogs [RMYR']n (M=Al, Ga, In; Y=N, P, As, Sb)," Coordination Chemistry Reviews (2005).

Vittal, "The chemistry of inorganic and organometallic compounds with adameantane-like structures," Polyhedron, vol. 15, No. 10, pp. 1585-1642 (1996).

Zhong et al, "Composition-Tunable ZnxCu1−xSe Nanocrytals with High Luminescence and Stability", Jrl Amer. Chem. Soc. (2003).

International Search Report for PCT/GB2006/003028 mailed Jan. 22, 2007 (5 pages).

Nielsch et al., "Uniform Nickel Deposition into Ordered Alumina Pores by Pulsed Electrodeposition", Advanced Materials, 2000 vol. 12, No. 8, pp. 582-586.

Huang et al., "Bio-Inspired Fabrication of Antireflection Nanostructures by Replicating Fly Eyes", Nanotechnology (2008) vol. 19.

Materials Research Society Symposium Proceedings Quantum Dots, Nanoparticles and Nanowires, 2004, ISSN: 0272-9172.

Xie et. al., "Synthesis and Characterization of Highly Luminescent CdSe-Core CdS/Zn0.5Cd0.5S/ZnS Multishell Nanocrystals," JACS Articles published on web Apr. 29, 2005.

Kim et. al., "Engineering InAsxP1−x/InP/ZnSe III-V Alloyed Core-Shell Quantum Dots for the Near-Infrared," JACS Articles published on web Jul. 8, 2005.

Rao et. al. "The Chemistry of Nanomaterials: Synthesis, Properties and Applications" (2004).

Trinidade et al., "Nanocrystalline Seminconductors: Synthesis, Properties, and Perspectives", Chemistry of Materials, (2001) vol. 13, No. 11, pp. 3843-3858.

International Search Report for PCT/GB2009/001928 mailed Dec. 8, 2009 (3 pages).

International Search Report for PCT/GB2009/002605 mailed Feb. 22, 2010 (3 pages).

Search Report for GB0813273.0 searched Dec. 8, 2008 (1 page).

Search Report for GB0814458.6 searched Dec. 5, 2008 (2 pages).

Search Report for GB0820101.4 searched Mar. 3, 2009 (1 page).

Search Report for GB0821122.9 searched Mar. 19, 2009 (2 pages).

Foneberov et al., "Photoluminescence of tetrahedral quantum-dot quantum wells" Physica E, 26:63-66 (2005).

Cao, "Effect of Layer Thickness on the Luminescence Properties of ZnS/CdS/ZnS quantum dot quantum well", J. of Colloid and Interface Science 284:516-520 (2005).

Harrison et al. "Wet Chemical Synthesis on Spectroscopic Study of CdHgTe Nanocrystals with Strong Near-Infrared Luminescence" Mat. Sci and Eng.B69-70:355-360 (2000).

Sheng et al. "In-Situ Encapsulation of Quantum Dots into Polymer Microspheres", Langmuir 22(8):3782-3790 (2006).

W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160) (1998).

International Search Report for PCT/GB2009/000510 mailed Jul. 6, 2010 (16 pages).

International Search Report for PCT/GB2008/003958 mailed Sep. 4, 2009 (4 pages).

Banger et al., "Ternary single-source precursors for polycrystalline thin-film solar cells" Applied Organometallic Chemistry, 16:617-627, XP002525473 Scheme 1 Chemical Synthesis (2002).

D Qi, M Fischbein, M Drndic, S. Selmic, "Efficient polymer-nanocrystal quantum-dot photodetectors", Appl. Phys. Lett., 2004, 84, 4295.

Shen et al., "Photoacoustic and photoelectrochemical characterization of CdSe-sensitized Ti02 electrodes composed of nanotubes and nanowires" Thin Solid Films, Elsevier-Sequoia S.A. Lausanne, CH vol. 499, No. 1-2, Mar. 21, 2006, pp. 299-305, XP005272241 ISSN: 0040-6090.

Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003, pp. 85-105, XP004400821 ISSN: 0927-0248.

Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030.

Wang, et al., "In situ polymerization of amphiphilic diacetylene for hole transport in solid state dye-sensitized solar cells" Organic Electronics, El Sevier, Amsterdam NL, vol. 7, No. 6, Nov. 18, 2006, pp. 546-550, XP005773063 ISSN: 1566-1199.

International Search Report and Written Opinion for PCT/GB2008/001457 mailed Aug. 21, 2008 (14 pages).

Richardson et al., "Chemical Engineering: Chemical and Biochemical Reactors and Process Control," vol. 3, Third Edition pp. 3-5 (1994).

Borchert et al., "High Resolution Photoemission STudy of CdSe and CdSe/ZnS Core-Shell Nanocrystals," Journal of Chemical Physics, vol. 119, No. 3, pp. 1800-1807 (2003).

Gaponik et al., "Thiol-Capping of CdTe Nanocrystals: An Alternative to Organometallic Synthetic Routes," Journal of Physical Chemistry B, vol. 106, No. 29, pp. 7177-7185 (2002).

Pickett et al., "Syntheses of Semiconductor Nanoparticles Using Single-Molecular Precursors," The Chemical Record, vol. 1 pp. 467-479 (2001).

Hu et al., Solar Cells: From basics to advanced systems. McGraw-Hill Book Co. pp. 73-74 (1983).

Talapin et al. "Synthesis of Surface-Modified Colloidal Semiconductor Nanocrystals and Study of Photoinduced Charge Separation and Transport in Nanocrystal-Polymer Composites," Physica E, vol. 14, pp. 237-241 (2002).

* cited by examiner

DIAGRAM OF a) CORE PARTICLE, b) CORE-SHELL PARTICLE, c) CORE-MULTI SHELL ORGANIC CAPPED PARTICLE

MOLECULAR CLUSTER USED AS SEEDING AGENTS

= ZINC ACETATE

= TRI-N-OCTYLPHOSPHINE SELENIDE

= $Zn_{10}(SEt)_{10}Et_{10}$

PREPARATION OF NANOPARTICLE MATERIALS

This application is a continuation of U.S. patent application Ser. No. 11/579,050filed Oct. 27, 2006 (now U.S. Pat. No. 7,803,423), which is the U.S. national stage application of International (PCT) Patent Application Serial No. PCT/GB2005/001611, filed Apr. 27, 2005, which claims the benefit of GB Application No. 0409877.8, filed Apr. 30, 2004. The entire disclosures of these three applications are hereby incorporated by reference as if set forth at length herein in their entirety.

There has been substantial interest in the preparation and characterisation, because of their optical, electronic and chemical properties, of compound semiconductors consisting of particles with dimensions in the order of 2-100 nm,[1-8] Often referred to as quantum dots and/or nanocrystals. These studies have occurred mainly due to their size-tuneable electronic, optical and chemical properties and the need for the further miniaturization of both optical and electronic devices[9,10] that now range from commercial applications as diverse as biological labelling, solar cells, catalysis, biological imaging, light-emitting diodes amongst many new and emerging applications.

Although some earlier examples appear in the literature,[11] recently methods have been developed from reproducible "bottom up" techniques, whereby particles are prepared atom-by-atom, i.e. from molecules to clusters to particles using "wet" chemical procedures.[12,13] Rather from "top down" techniques involving the milling of solids to finer and finer powders.

To-date the most studied and prepared of semiconductor materials have been the chalcogenides II-VI materials namely ZnS, ZnSe, CdS, CdSe, CdTe; most noticeably CdSe due to its tuneability over the visible region of the spectrum. As mentioned semiconductor nanoparticles are of academic and commercial interest due to their differing and unique properties from those of the same material, but in the macro crystalline bulk form. Two fundamental factors, both related to the size of the individual nanoparticle, are responsible for their unique properties. The first is the large surface to volume ratio; as a particle becomes smaller, the ratio of the number of surface atoms to those in the interior increases. This leads to the surface properties playing an important role in the overall properties of the material. The second factor is that, with semiconductor nanoparticles, there is a change in the electronic properties of the material with size, moreover, the band gap gradually becoming larger because of quantum confinement effects as the size of the particles decreases. This effect is a consequence of the confinement of an 'electron in a box' giving rise to discrete energy levels similar to those observed in atoms and molecules, rather than a continuous band as in the corresponding bulk semiconductor material. Thus, for a semiconductor nanoparticle, because of the physical parameters, the "electron and hole", produced by the absorption of electromagnetic radiation, a photon, with energy greater then the first excitonic transition, are closer together than in the corresponding macrocrystalline material, so that the Coulombic interaction cannot be neglected. This leads to a narrow bandwidth emission, which is dependent upon the particle size and composition. Thus, quantum dots have higher kinetic energy than the corresponding macrocrystalline material and consequently the first excitonic transition (band gap) increases in energy with decreasing particle diameter.

Single core nanoparticles, which consist of a single semiconductor material along with an outer organic passivating layer, tend to have relatively low quantum efficiencies due to electron-hole recombination occurring at defects and daggling bonds situated on the nanoparticle surface which lead to non-radiative electron-hole recombinations. One method to eliminate defects and daggling bonds is to grow a second material, having a wider band-gap and small lattice mismatch with the core material, epitaxially on the surface of the core particle, (e.g. another II-VI material) to produce a "core-shell particle". Core-shell particles separate any carriers confined in the core from surface states that would otherwise act as non-radiative recombination centres. One example is ZnS grown on the surface of CdSe cores. The shell is generally a material with a wider bandgap then the core material and with little lattice mismatch to that of the core material, so that the interface between the two materials has as little lattice strain as possible. Excessive strain can further result in defects and non-radiative electron-hole recombination resulting in low quantum efficiencies.

However, the growth of more than a few monolayers of shell material can have the reverse effect thus; the lattice mismatch between CdSe and ZnS, is large enough that in a core-shell structure only a few monolayers of ZnS can be grown before a reduction of the quantum yield is observed, indicative of the formation of defects due to breakdown in the lattice as a result of high latticed strain. Another approach is to prepare a core-multi shell structure where the "electron-hole" pair are completely confined to a single shell such as the quantum dot-quantum well structure. Here, the core is of a wide bandgap material, followed by a thin shell of narrower bandgap material, and capped with a further wide bandgap layer, such as CdS/HgS/CdS grown using a substitution of Hg for Cd on the surface of the core nanocrystal to deposit just 1 monolayer of HgS.[14] The resulting structures exhibited clear confinement of photoexcited carriers in the HgS layer.

The coordination about the final inorganic surface atoms in any core, core-shell or core-multi shell nanoparticles is incomplete, with highly reactive "daggling bonds" on the surface, which can lead to particle agglomeration. This problem is overcome by passivating (capping) the "bare" surface atoms with protecting organic groups. The capping or passivating of particles not only prevents particle agglomeration from occurring, it also protects the particle from its surrounding chemical environment, along with providing electronic stabilization (passivation) to the particles in the case of core material. The capping agent usually takes the form of a Lewis base compound covalently bound to surface metal atoms of the outer most inorganic layer of the particle, but more recently, so as to incorporate the particle into a composite, an organic system or biological system can take the form of, an organic polymer forming a sheaf around the particle with chemical functional groups for further chemical synthesis, or an organic group bonded directly to the surface of the particle with chemical functional groups for further chemical synthesis.

Many synthetic methods for the preparation of semiconductor nanoparticles have been reported, early routes applied conventional colloidal aqueous chemistry, with more recent methods involving the kinetically controlled precipitation of nanocrystallites, using organometallic compounds.

Over the past six years the important issues have concerned the synthesis of high quality semiconductor nanoparticles in terms of uniform shape, size distribution and quantum efficiencies. This has lead to a number of methods that can routinely produce semiconductor nanoparticles, with monodispersity of <5% with quantum yields >50%. Most of these methods are based on the original "nucleation and growth" method described by Murray, Norris and Bawendi,[15] but use other precursors that the organometallic ones used. Murray et al originally used organometallic solutions of metal-alkyls ($R_2M$) M=Cd, Zn, Te; R=Me, Et and tri-n-octylphosphine sulfide/selenide (TOPS/Se) dissolved in tri-n-octylphosphine (TOP). These precursor solutions are injected into hot tri-n-octylphosphine oxide (TOPO) in the temperature range 120-400° C. depending on the material being produced. This produces TOPO coated/capped semiconductor nanoparticles of II-VI material. The size of the particles is controlled by the temperature, concentration of precursor used and length of time at which the synthesis is undertaken, with larger particles being obtained at higher temperatures, higher precursor concentrations and prolonged reaction times. This organometallic route has advantages over other synthetic methods, including near monodispersity <5% and high particle cystallinity. As mentioned, many variations of this method have now appeared in the literature which routinely give high quality core and core-shell nanoparticles with monodispersity of <5% and quantum yield >50% (for core-shell particles of as-prepared solutions), with many methods displaying a high degree of size[16] and shape[17] control.

Recently attention has focused on the use of "greener"† precursors which are less exotic and less expensive but not necessary more environmentally friendly. Some of these new precursors include the oxides, CdO;[18] carbonates $MCO_3$ M=Cd, Zn; acetates $M(CH_3CO_2)_2$ M=Cd, Zn and acetylacetanates $[CH_3COCH=C(O^-)CH_3]_2$ M=Cd, Zn; amongst other.[19,20]

†(The use of the term "greener" precursors in semiconductor particle synthesis has generally taken on the meaning of cheaper, readily available and easier to handle precursor starting materials, than the originally used organometallics which are volatile and air and moisture sensitive, and does not necessary mean that "greener precursors" are any more environmentally friendly).

Single-source precursors have also proved useful in the synthesis of semiconductor nanoparticle materials of II-VI, as well as other compound semiconductor nanoparticles. Bis (dialkyldithio-/diseleno-carbamato)cadmium(II)/zinc(II) compounds, $M(E_2CNR_2)_2$ (M=Zn or Cd, E=S or Se and R=alkyl), have used a similar 'one-pot' synthetic procedure, which involved dissolving the precursor in tri-n-octylphosphine (TOP) followed by rapid injection into hot tri-n-octylphosphine oxide/tri-n-octylphosphine (TOPO/TOP) above 200° C.

For all the above methods rapid particle nucleation followed by slow particle growth is essential for a narrow particle size distribution. All these synthetic methods are based on the original organometallic "nucleation and growth" method by Murray et al[15] which involves the rapid injection of the precursors into a hot solution of a Lewis base coordinating solvent (capping agent) which may also contain one of the precursors. The addition of the cooler solution subsequently lowers the reaction temperature and assist particle growth but inhibits further nucleation. The temperature is then maintained for a period of time, with the size of the resulting particles depending on reaction time, temperature and ratio of capping agent to precursor used. The resulting solution is cooled followed by the addition of an excess of a polar solvent (methanol or ethanol or sometimes acetone) to produce a precipitate of the particles that can be isolated by filtration or centrifugation.

Due to their increased covalent nature III-V and IV-VI highly crystalline semiconductor nanoparticles are more difficult to prepare and much longer annealing time are usually required. However, there are now many reports[15] II-VI and IV-VI materials being prepared by a similar procedure GaN,[21] GaP,[22] GaAs,[22,23,24,25,26] InP,[27,28,29] InAs[30,27] and for PbS[31] and PbSe.[32]

Fundamentally all these preparations rely on the principle of particle nucleation followed by growth, moreover, to have a monodispersed ensemble of nanoparticles there must be proper separation of nanoparticles nucleation from nanoparticle growth. This is achieved by rapid injection of one or both precursors into a hot coordinating solvent (containing the other precursor if otherwise not present) which initiates particles nucleation, however, the sudden addition of the cooler solution upon injection subsequently lowers the reaction temperature (the volume of solution added is about ⅓ of the total solution) and inhibits further nucleation maintaining a narrow nanoparticle size distribution. Particle growth being a surface catalyzes process or via Ostwald ripening, depending on the precursor's used[33], continues at the lower temperature and thus nucleation and growth are separated. This method works well for small scale synthesis where one solution can be added rapidly to another while keeping an homogenous temperature throughout the reaction. However, on larger preparative scale whereby large volumes of solution are required to be rapidly injected into one another a temperature differential can occur within the reaction which can subsequently lead to a large particle size distribution.

Preparation from single-source molecular clusters, Cooney and co-workers used the cluster $[S_4Cd_{10}(SPh)_{16}]$ $[Me_3NH]_4$ to produce nanoparticles of CdS via the oxidation of surface-capping $SPh^-$ ligands by iodine. This route followed the fragmentation of the majority of clusters into ions which were consumed by the remaining $[S_4Cd_{10}(SPh)_{16}]^{4-}$ clusters which subsequently grow into nanoparticles of CdS.34

Strouse[35] and co-workers used a similar synthetic approach but employed thermolysis (lyothermal) rather than a chemical agent to initiate particle growth. Moreover, the single-source precursors $[M_{10}Se_4(SPh)_{16}][X]_4$ $X=Li^+$ or $(CH_3)_3NH^+$, M=Cd or Zn were thermolysised whereby fragmentation of some clusters occurs followed by growth of other from scavenging of the free M and Se ions or simply from clusters aggregating to form larger clusters and then small nanoparticles which subsequently continue to grow into larger particles.

According to the present invention there is provided a method of producing nanoparticles comprising effecting conversion of a nanoparticle precursor composition to the material of the nanoparticles, said precursor composition comprising a first precursor species containing a first ion to be incorporated into the growing nanoparticles and a separate second precursor species containing a second ion to be incorporated into the growing nanoparticles, wherein said conversion is effected in the presence of a molecular cluster compound under conditions permitting seeding and growth of the nanoparticles.

The present invention relates to a method of producing nanoparticles of any desirable form and allows ready production of a monodisperse population of such particles which are consequently of a high purity. It is envisaged that the invention is suitable for producing nanoparticles of any particular size, shape or chemical composition. A nanoparticle may have a size falling within the range 2-100 nm. A sub-class of nanoparticles of particular interest is that relating to compound semiconductor particles, also known as quantum dots or nanocrystals.

An important feature of the invention is that conversion of the precursor composition (comprising separate first and second precursor species) to the nanoparticles is effected in the presence of a molecular cluster compound (which will be other than the first or second precursor species). Without wishing to be bound by any particular theory, one possible mechanism by which nanoparticle growth may take place is that each identical molecule of the cluster compound acts as a seed or nucleation point upon which nanoparticle growth can be initiated. In this way, nanoparticle nucleation is not necessary to initiate nanoparticle growth because suitable nucleation sites are already provided in the system by the molecular clusters. The molecules of the cluster compound act as a template to direct nanoparticle growth. 'Molecular cluster' is a term which is widely understood in the relevant technical field but for the sake of clarity should be understood herein to relate to clusters of 3 or more metal or non-metal atoms and their associated ligands of sufficiently well defined chemical structure such that all molecules of the cluster compound possess the same relative molecular mass. Thus the molecular clusters are identical to one another in the same way that one $H_2O$ molecule is identical to another $H_2O$ molecule. The use of the molecular cluster compound provides a population of nanoparticles that is essentially monodisperse. By providing nucleation sites which are so much more well defined than the nucleation sites employed in previous work the nanoparticles formed using the method of the present invention possess a significantly more well defined final structure than those obtained using previous methods. A further significant advantage of the method of the present invention is that it can be more easily scaled-up for use in industry than current methods. Methods of producing suitable molecular cluster compounds are known within the art, examples of which can be found at the Cambridge Crystallographic Data Centre (www.ccdc.ca.ac.uk).

The conversion of the precursor composition to nanoparticle is carried out under conditions to ensure that there is either direct reaction and growth between the precursor composition and cluster, or some clusters grow at the expense of others, due to Ostwald ripening, until reaching a certain size at which there is direct growth between the nanoparticle and the precursor composition. Such conditions ensure that the monodispersity of the cluster compound is maintained throughout nanoparticle growth which, in turn, ensures that a monodisperse population of nanoparticles is obtained.

Any suitable molar ratio of the molecular cluster compound to first and second nanoparticle precursors may be used depending upon the structure, size and composition of the nanoparticles being formed, as well as the nature and concentration of the other reagents, such as the nanoparticle precursor(s), capping agent, size-directing compound and solvent. It has been found that particularly useful ratios of the number of moles of cluster compound compared to the total number of moles of the first and second precursor species preferably lie in the range 0.0001-0.1 (no. moles of cluster compound): 1 (total no. moles of first and second precursor species), more preferably 0.001-0.1:1, yet more preferably 0.001-0.060:1. Further preferred ratios of the number of moles of cluster compound compared to the total number of moles of the first and second precursor species lie in the range 0.002-0.030:1, and more preferably 0.003-0.020:1. In particular, it is preferred that the ratio of the number of moles of cluster compound compared to the total number of moles of the first and second precursor species lies in the range 0.0035-0.0045:1.

It is envisaged that any suitable molar ratio of the first precursor species compared to the second precursor species may be used. For example, the molar ratio of the first precursor species compared to the second precursor species may lie in the range 100-1 (first precursor species): 1 (second precursor species), more preferably 50-1:1. Further preferred ranges of the molar ratio of the first precursor species compared to the second precursor species lie in the range 40-5:1, more preferably 30-10:1. In certain applications it is preferred that approximately equal molar amounts of the first and second precursor species are used in the method of the invention. The molar ratio of the first precursor species compared to the second precursor species preferably lies in the range 0.1-1.2: 1, more preferably, 0.9-1.1:1, and most preferably 1:1. In other applications, it may be appropriate to use approximately twice the number of moles of one precursor species compared to the other precursor species. Thus the molar ratio of the first precursor species compared to the second precursor species may lie in the range 0.4-0.6:1, more preferably the molar ratio of the first precursor species compared to the second precursor species is 0.5:1. It is to be understood that the above precursor molar ratios may be reversed such that they relate to the molar ratio of the second precursor species compared to the first precursor species. Accordingly, the molar ratio of the second precursor species compared to the first precursor species may lie in the range 100-1 (second precursor species): 1 (first precursor species), more preferably 50-1:1, 40-5:1, or 30-10:1. Furthermore, the molar ratio of the second precursor species compared to the first precursor species may lie in the range 0.1-1.2:1, 0.9-1.1:1, 0.4-0.6:1, or may be 0.5:1.

The method of the present invention concerns the conversion of a nanoparticle precursor composition to a desired nanoparticle. Suitable precursor compositions comprise two or more separate precursor species each of which contains at least one ion to be included in the growing nanoparticle. The total amount of precursor composition required to form the final desired yield of nanoparticles can be added before nanoparticle growth has begun, or alternatively, the precursor composition can be added in stages throughout the reaction.

The conversion of the precursor composition to the material of the nanoparticles can be conducted in any suitable solvent. In the method of the present invention it is important to ensure that when the cluster compound and precursor composition are introduced in to the solvent the temperature of the solvent is sufficiently high to ensure satisfactory dissolution and mixing of the cluster compound and precursor composition. Once the cluster compound and precursor composition are sufficiently well dissolved in the solvent the temperature of the solution thus formed is raised to a temperature, or range of temperatures, which is/are sufficiently high to initiate nanoparticle growth. The temperature of the solution can then be maintained at this temperature or within this temperature range for as long as required to form nanoparticles possessing the desired properties.

A wide range of appropriate solvents are available. The particular solvent used is usually at least partly dependent upon the nature of the reacting species, i.e. precursor composition and/or cluster compound, and/or the type of nanoparticles which are to be formed. Typical solvents include Lewis base type coordinating solvents, such as a phosphine (e.g. TOP), a phosphine oxide (e.g. TOPO) or an amine (e.g. HDA), or non-coordinating organic solvents, e.g. alkanes and alkenes. If a non-coordinating solvent is used then it will usually be used in the presence of a further coordinating agent to act as a capping agent for the following reason.

If the nanoparticles being formed are intended to function as quantum dots it is important to ensure that any dangling bonds on the surface of the nanoparticles are capped to minimise non-radiative electron-hole recombinations and inhibit particle agglomeration which can lower quantum efficiencies. A number of different coordinating solvents are known which can also act as capping or passivating agents, e.g. TOP, TOPO or HDA. If a solvent is chosen which cannot act as a capping agent then any desirable capping agent can be added to the reaction mixture during nanoparticle growth. Such capping agents are typically Lewis bases but a wide range of other agents are available, such as oleic acid and organic polymers which form protective sheaths around the nanoparticles.

A further way to avoid problems related to non-radiative electron-hole recombinations is to grow one or more shells around the nanoparticle core to form a 'core-shell' nanoparticle. Such shells are well known in the art and are typically comprised of a different material to that of the core. The shell material is usually selected so as to have a wider band gap than the core material but to have as little lattice mismatch with the core as possible to minimise lattice strain at the core-shell interface which could lower quantum efficiencies due to non-radiative electron-hole recombinations.

The progress of nanoparticle growth can be monitored in any convenient way, such as photoluminescence (PL) or UV-visible (UV-vis) spectroscopy. Once nanoparticles have been produced having the desired properties, e.g. when a nanoparticle peak is observed on the PL/UV-vis emission spectra at the desired wavelength, further growth is inhibited by altering the reaction conditions, e.g. reducing the temperature of the solution below that necessary to support nanoparticle growth. At this stage the nanoparticles can be isolated immediately from solution by any convenient means, such as precipitation, or allowed to anneal at a suitable temperature for any desirable amount of time, e.g. 10 minutes to 72 hours, to 'size-focus' via Ostwald ripening prior to isolation. Following initial isolation, the nanoparticle material may then be subject to one or more rounds of washing to provide a final product of high purity.

It is also envisaged that a shape directing compound, such as a phosphonic acid derivative, may be added to the reaction mixture to encourage the growing nanoparticles to adopt a particular shape, e.g. spheres, rods, disks, tetrapods or stars, which may be of use in particular applications.

The invention comprises of a method to produce nanoparticle materials mainly but not restricted to compound semiconductor nanoparticles from the use of molecular clusters, whereby the clusters are defined identical molecular entities, as compared to ensembles of small nanoparticles, which inherently lack the anonymous nature of molecular clusters. The invention consists of the use of molecular clusters as templates to seed the growth of nanoparticles, whereby other molecular sources "molecular feedstocks" are used to facilitate particle growth. These molecular feedstocks are a combination of separate precursors each containing one or more element/ion required within the as to be grown nanoparticles.

Type of System to be Made

The present invention is directed to the preparation of a number of nanoparticles materials and includes compound semiconductor particles otherwise referred to as quantum dots or nanocrystals, within the size range 2-100 nm and include core material comprising of:—

IIA-VIB (2-16) material, consisting of a first element from group 2 of the periodic table and a second element from group 16 of the periodic table and also including ternary and quaternary materials and doped materials. Nanoparticle material include but are not restricted to:—MgS, MgSe, MgTe, CaS, CaTe, SrS, SrSe, SrTe, BaS, BaSe, BaTe.

IIB-VIB (12-16) material consisting of a first element from group 12 of the periodic table and a second element from group 16 of the periodic table and also including ternary and quaternary materials and doped materials. Nanoparticle material includes but are not restricted to:—ZnS, ZnSe, ZnTe, CdS, CdSe, CdTe, HgS, HgSe, HgTe.

II-V material consisting of a first element from group 12 of the periodic table and a second element from group 15 of the periodic table and also including ternary and quaternary materials and doped materials. Nanoparticle material include but is not restricted to:—$Zn_3P_2$, $Zn_3As_2$, $Cd_3P_2$, $Cd_3As_2$, $Cd_3N_2$, $Zn_3N_2$.

III-V material consisting of a first element from group 13 of the periodic table and a second element from group 15 of the periodic table and also including ternary and quaternary materials and doped materials. Nanoparticle material include but is not restricted to:—BP, AlP, AlAs, ALSb; GaN, GaP, GaAs, GaSb; InN, InP, InAs, InSb, BN.

III-IV material consisting of a first element from group 13 of the periodic table and a second element from group 16 of the periodic table and also including ternary and quaternary materials and doped materials. Nanoparticle material include but is not restricted to:—$B_4C$, $Al_4C_3$, $Ga_4C$.

III-VI material consisting of a first element from group 13 of the periodic table and a second element from group 16 of the periodic table and also including ternary and quaternary materials. Nanoparticle material include but is not restricted to:—$Al_2S_3$, $Al_2Se_3$, $Al_2Te_3$, $Ga_2S_3$, $Ga_2Se_3$, GeTe; $In_2S_3$, $In_2Se_3$, $Ga_2Te_3$, $In_2Te_3$, InTe.

IV-VI material consisting of a first element from group 14 of the periodic table and a second element from group 16 of the periodic table, and also including ternary and quaternary materials and doped materials. Nanoparticle material include but is not restricted to:—PbS, PbSe, PbTe, $Sb_2Te_3$, SnS, SnSe, SnTe.

Nanoparticle material consisting of a first element from any group in the transition metal of the periodic table, and a second element from any group of the d-block elements of the periodic table and also including ternary and quaternary materials and doped materials. Nanoparticle material include but is not restricted to:—NiS, CrS, $CuInS_2$.

By the term doped nanoparticle for the purposes of specifications and claims, refer to nanoparticles of the above and a dopant comprised of one or more main group or rare earth elements, this most often is a transition metal or rare earth element, such as but not limited to zinc sulfide with manganese, such as ZnS nanoparticles doped with $Mn^+$.

Ternary Phase

By the term ternary phase nanoparticle for the purposes of specifications and claims, refer to nanoparticles of the above but a three component material. The three components are usually compositions of elements from the as mentioned groups Example being $(Zn_xCd_{x-1}S)_mL_n$, nanocrystal (where L is a capping agent).

Quaternary Phase

By the term quaternary phase nanoparticle for the purposes of specifications and claims, refer to nanoparticles of the above but a four-component material. The four components are usually compositions of elements from the as mentioned groups Example being $(Zn_xCd_{x-1}S_ySe_{y-1})_mL_n$ nanocrystal (where L is a capping agent).

Solvothermal

By the term Solvothermal for the purposes of specifications and claims, refer to heating the reaction solution so as to initiate and sustain particle growth and can also take the meaning solvothermal, thermolysis, thermolsolvol, solution-pyrolysis, lyothermal.

Core-Shell and Core/Multi Shell Particles

The material used on any shell or subsequent numbers of shells grown onto the core particle in most cases will be of a similar lattice type material to the core material i.e. have close lattice match to the core material so that it can be epitaxially grown on to the core, but is not necessarily restricted to materials of this compatibility. The material used on any shell or subsequent numbers of shells grown on to the core present in most cases will have a wider band-gap then the core material but is not necessarily restricted to materials of this compatibility. The materials of any shell or subsequent numbers of shells grown on to the core can include material comprising of:—

IIA-VIB (2-16) material, consisting of a first element from group 2 of the periodic table and a second element from group 16 of the periodic table and also including ternary and quaternary materials and doped materials. Nanoparticle material include but is not restricted to:—MgS, MgSe, MgTe, CaS, CaSe, CaTe, SrS, SrSe, SrTe.

IIB-VIB (12-16) material consisting of a first element from group 12 of the periodic table and a second element from group 16 of the periodic table and also including ternary and quaternary materials and doped materials. Nanoparticle material include but is not restricted to:—ZnS, ZnSe, ZnTe, CdS, CdSe, CdTe, HgS, HgSe, HgTe.

II-V material consisting of a first element from group 12 of the periodic table and a second element from group 15 of the periodic table and also including ternary and quaternary materials and doped materials. Nanoparticle material include but is not restricted to:—$Zn_3P_2$, $Zn_3As_2$, $Cd_3P_2$, $Cd_3As_2$, $Cd_3N_2$, $Zn_3N_2$.

III-V material consisting of a first element from group 13 of the periodic table and a second element from group 15 of the periodic table and also including ternary and quaternary materials and doped materials. Nanoparticle material include but is not restricted to:—BP, AlP, AlAs, AlSb; GaN, GaP, GaAs, GaSb; InN, InP, InAs, InSb, AlN, BN.

III-IV material consisting of a first element from group 13 of the periodic table and a second element from group 16 of the periodic table and also including ternary and quaternary materials and doped materials. Nanoparticle material include but is not restricted to:—$B_4C$, $Al_4C_3$, $Ga_4C$.

III-VI material consisting of a first element from group 13 of the periodic table and a second element from group 16 of the periodic table and also including ternary and quaternary materials. Nanoparticle material include but is not restricted to:—$Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$.

IV-VI material consisting of a first element from group 14 of the periodic table and a second element from group 16 of the periodic table and also including ternary and quaternary materials and doped materials. Nanoparticle material include but is not restricted to:—PbS, PbSe, PbTe, $Sb_2Te_3$, SnS, SnSe, SnTe.

Nanoparticle material consisting of a first element from any group in the transition metal of the periodic table, and a second element from any group of the d-block elements of the periodic table and also including ternary and quaternary materials and doped materials. Nanoparticle material include but is not restricted to:—NiS, CrS, $CuInS_2$.

Outer Most Particle Layer
Capping Agent

The outer most layer (capping agent) of organic material or sheath material is to inhibit particles aggregation and to protect the nanoparticle from the surrounding chemical environment and to provide a means of chemical linkage to other inorganic, organic or biological material. The capping agent can be the solvent that the nanoparticle preparation is undertaken in, and consists of a Lewis base compound whereby there is a lone pair of electrons that are capable of donor type coordination to the surface of the nanoparticle and can include momo- or mulit-dentate ligands of the type but not restricted to:—phosphines (trioctylphosphine, triphenolphosphine, t-butylphosphine), phosphine oxides (trioctylphosphine oxide), alkyl-amine (hexadecylamine, octylamine), ary-amines, pyridines, and thiophenes.

The outer most layer (capping agent) can consist of a coordinated ligand that processes a functional group that can be used as a chemical linkage to other inorganic, organic or biological material such as but not restricted to:—mercapto-functionalized amines or mercaptocarboxylic acids.

The outer most layer (capping agent) can consist of a coordinated ligand that processes a functional group that is polymerisable and can be used to form a polymer around the particle, polymerisable ligands such as but not limited to styrene functionalized amine, phosphine or phosphine oxide ligand.

Nanoparticle Shape

The shape of the nanoparticle is not restricted to a sphere and can consist of but not restricted to a rod, sphere, disk, tetrapod or star. The control of the shape of the nanoparticle is by the addition of a compound that will preferentially bind to a specific lattice plane of the growing particle and subsequently inhibit or slow particle growth in a specific direction. Example of compounds that can be added but is not restricted to include:—phosphonic acids (n-tetradecylphosphonic acid, hexylphoshonic acid, 1-decanesulfonic acid, 12-hydroxy-dodecanoic acid, n-octadecylphosphonic acid).

Description of Preparative Procedure

The current invention should lead to pure, monodispersed, nanocrystalline particles that are stabilized from particle aggregation and the surrounding chemical environment by an organic layer, where M and E are two different elements in a $(ME)_nL_y$ particles and L being the coordinating organic layer/capping agent, such as a II-VI semiconductor $(ZnS)_n(TOPO)_y$, nanoparticle constituting of a ZnS core surrounded by trioctylphosphine oxide ligands (TOPO).

The first step for preparing nanoparticles of a semiconductor material is to use a molecular cluster as a template to seed the growth of nanoparticles from other element source precursors. This is achieved by mixing small quantity of a cluster which is to be used as the template with a high boiling solvent which can also be the capping agent, being a Lewis base coordination compound such as but not restricted to a phosphine, a phosphine oxide or an amine such as TOP, TOPO or HDA; or an inert solvent such as an alkane (octadecene) with the addition of a capping agent compound such as oleic acid. Further to this a source for M and a source for E (for a ME particle) are added to the reaction mixture. The M and E precursor are in the form of two separate precursors one containing M and the other containing E.

Further to this other regents may or may not be added to the reactions which have the ability to control the shape of the nanoparticles grown. These additives are in the form of a compound that can preferentially bind to a specific face (lattice plane) of the growing nanoparticle and thus inhibit or slow grow along that specific direction of the particle. Other element source precursors may or may not be added to the reaction so as to produce ternary, quaternary or doped particles.

Initially, the compounds of the reaction mixture are allowed to mix on a molecular level at a low enough temperature where no particle growth will occur. The reaction mixture is then heated at a steady rate until particle growth is initiated upon the surfaces of the molecular cluster-templates. At an appropriate temperature after the initiation of particle growth further quantities of M and E precursors may be added to the reaction mixture if needed so as to inhibit particles consuming one another by the process of Ostward ripening. Further precursor addition can be in the form of batch addition whereby solid precursor or solutions containing precursor are added over a period of time or by continuous dropwise addition. Because of the complete separation of particle nucleation and growth, the current invention displays a high degree of control in terms of particle size, which is controlled by the temperature of the reaction and concentrations of precursors present. Once the desired particle size is obtained, as established from UV and/or PL spectra of the reaction solution either by an in situ optical probe or from aliquots of the reaction solution, the temperature may or may not be reduced by ca. 30-40° C. and the mixture left to "size-focus" for a period of time being from 10 minutes to 72 hours.

Further consecutive treatment of the as formed nanoparticles to form core-shell or core-multi shell particles may be undertaken. Core-shell particle preparation is undertaken either before or after nanoparticle isolation, whereby the nanoparticles are isolated from the reaction and redissolved in new (clean) capping agent as this results in a better quantum yield. A source for N and a source for Y precursor are added to the reaction mixture and can be either in the form of two separate precursors one containing N and the other containing Y or as a single-source precursor that contains both N and Y within a single molecule to form a core-shell particle of ME/NY core-shell material.

The process may be repeated with the appropriate element precursors until the desired core-multi shell material is formed. The nanoparticles size and size distribution in an ensemble of particles is dependent by the growth time, temperature and concentrations of reactants in solution, with higher temperatures producing larger nanoparticles.

Type of Cluster Used for Seeding

The invention includes the use of molecular clusters, whereby the clusters used are identical molecular entities as compared to nanoparticles, which inherently lack the anonymous nature of molecular clusters in an assembly. The clusters act as "embryo-type" templates for the growth of nanoparticles whereby other molecular sources precursors contribute ions to the growth process and thus clusters subsequently grow into particles. The molecular clusters to be used can consist of:—

Both elements required within the as to be grown nanoparticle either with or without other elements present plus organic moieties;

One element required within the as to be grown nanoparticle either with or without other elements present plus organic moieties;

Neither element required within the as to be grown nanoparticle either with or without other elements present plus organic moieties;

The requirement of a cluster used, is to initiate particle growth either via consumption of other clusters or from reaction with the precursors present. Thus, the cluster can be used as a template for particle growth.

Examples, clusters to be used but not restricted to include:—

IIB-VIB:—[{(PPh$_3$)Hg}$_4$(SPh)$_6$]: (Ph$_4$P)$_2$[(SEt)$_5$(Br) (HgBr)$_4$]: (Ph$_4$P)$_2$[Hg$_4$(SEt)$_5$Br]: [Hg$_4$Te$_{12}$] [N(CH$_2$CH$_2$Et)$_4$]$_4$

IIB-VIB:—[Et$_3$NH]$_4$[Cd$_{10}$Se$_4$(SPh)$_{16}$]; [RME$^t$Bu]$_5$ M=Zn, Cd, Hg; E=S, Se, Te; R=Me, Et, Ph: [X]$_4$ [E$_4$M$_{10}$(SR)$_{16}$] E=S, Se, Te, M=Zn, Cd, Hg; X=Me$_3$NH$^+$, Li$^+$, Et$_3$NH$^+$: [Cd$_{32}$S$_{14}$(SPh)$_{36}$].L: [Hg$_{10}$Se$_4$(SePh) (PPh$_2$$^n$Pr)$_4$]; [Hg$_{32}$Se$_{14}$(SePh)$_{36}$]; [Cd$_{10}$Se$_4$(SePh)$_{12}$ (PPr$_3$)$_4$]; [Cd$_{32}$Se$_{14}$(SePh)$_{36}$(PPh$_3$)$_4$]; [M$_4$(SPh)$_{12}$]$^+$[X]$_2$ M=Zn, Cd, Hg; X=Me$_4$N$^+$, Li$^+$: [Zn(SEt)Et]$_{10}$: [MeMEiPr] M=Zn, Cd, Hg; E=S, Se, Te: [RCdSR']$_5$ R=O(ClO$_3$), R'=PPh$_3$, $^i$Pr: [Cd$_{10}$E$_4$(E'Ph)$_{12}$(PR$_3$)$_4$] E, E'=Te, Se, S: [Cd$_8$Se(SePh)$_{12}$Cl$_4$]$^{2-}$: [M$_4$Te$_{12}$]$^{4-}$ M=Cd, Hg: [Ph$_{12}$M$_{18}$Cd$_{10}$(PEt$_3$)$_3$] M=Te, Se:

II-V:—[RCdNR']$_4$ R=Cl, Br, I, PEt$_3$, C≡CSMe$_3$; R'=PEt$_3$, I: [RCdNR']$_5$ R=alkyl or aryl group and R'=alkyl or aryl group: [{RZn}$_6${PR'}$_4$] R=I, PEt$_2$Ph, R'=SiMe$_3$: [M$_4$Cl$_4$ (PPh$_2$)$_4$(P''Pr$_3$)$_2$] M=Zn, Cd: [Li(thf)$_4$]$_2$[(Ph$_2$P)$_{10}$Cd$_4$]: [Zn$_4$ (PPh$_2$)$_4$Cl$_4$(PRR$_2$')$_2$] PRR'$_2$=PMe''Pr$_2$, P''Bu$_3$, PEt$_2$Ph: [Zn$_4$ (P$^i$Bu$_2$)$_4$Cl$_4$]

III-V [EtGaNEt]$_6$; [MeGaN(4-C$_6$H$_4$F)]$_6$; (MeGaNiBu)$_6$; [RAlNR']$_4$ R=Me, CH$_2$Pr$^i$, Ph; R'=Pr$^i$, CH$_2$Pr$^i$, C$_6$H$_2$Me$_3$; [(SiPr$^i$$_3$)$_3$AsAlH]$_6$; [$^i$PrNAlH]$_4$; [RAlNR']$_6$ R=Me, Et, Cl, CH$_2$Ph, CH$_2$Pr$^i$, Ph; R'=Me H, Br, C≡CPh, Pr$^i$, (CH$_2$)$_2$Me, (CH$_2$)2NMe$_2$, SiPh$_3$: [CH$_3$Ga—NCH$_2$CH(CH$_3$)$_2$]$_6$: [MeGa-N$^i$Bu]$_6$: [RGaNR']$_4$ R=Ph, Me; R'=Ph, C$_6$F$_5$, SiMe$_3$, $^t$Bu: [EtGaNEt]$_6$: [RGaPR']$_4$ R=$^i$Pr, C$_6$H$_2$Me$_3$; R'=$^t$Bu: C$_6$H$_2$Me$_3$: [RNInR']$_4$ R=Cl, Br, I, Me; R'=$^t$Bu, C$_6$F$_5$, C$_6$H$_4$F: [RInPR']$_4$ R=$^i$Pr, C$_6$H$_2$Me$_3$, Et; R'=SiPh$_3$, C$_6$H$_2$Me$_3$, Si$^i$Pr$_3$: [RInPR']$_6$ R=Et, R'=SiMe$_2$(CMe$_2$$^i$Pr)

III-VI [($^t$Bu)GaSe]$_4$; [$^t$BuGaS]$_7$; [RInSe]$_4$ R=$^t$Bu, CMe$_2$Et, Si($^t$Bu)$_3$, C((SiMe$_3$)$_3$)$_3$; [RInS]$_4$ R=43u, CMe$_2$Et; [RGaS]$_4$ R=$^t$Bu, CMe$_2$Et, CEt$_3$: [SAlR$^-$]$_4$ R=C(SMe$_3$)$_3$, CEtMe$_2$: [SAlNMe$_3$]$_5$: [TeAlR]4 R=Cp*, CEtMe$_2$: [(C (SiMe$_3$)$_3$)GaS]$_4$: [$^t$BuGaS]$_6$: [RGaSe]$_4$ R=13u, CMe$_2$Et, CEt$_3$, C(SiMe$_3$)$_3$, Cp*, Bu: Cd$_4$In$_{16}$ S$_{33}$. (H$_2$O)$_{20}$ (C$_{10}$H$_{28}$N$_4$)$_{2.5}$:

IV-VI [S$_6${SnR}$_4$] R=C(SiMe$_3$)$_3$, Me, Ph; [Se$_6${SnR}$_4$] R=C$_6$F$_5$, C$_6$H$_2$Me$_3$, p-Tol, C(SiMe$_3$)$_3$

Material consisting of a first element from any group in the transition metals of the periodic table and a second element from any group of the d-block elements include but are not restricted to:—[Cu$_{12}$Se$_6$(PR$_3$)$_8$] R=Et$_2$Ph, $''$Pr$_3$, Cy$_3$; [Cu$_{18}$Te$_6$($^t$Bu)$_6$(PPh$_2$Et)$_7$]; [Cu$_{19}$Te$_6$($^t$Bu)$_7$(PEt$_3$)$_8$]; [Cu$_{27}$Te$_5$(P$^i$Pr$_2$Me)$_{12}$]; [Ni$_{34}$Se$_{22}$(PPh$_3$)$_{10}$]; [Ag$_{30}$(TePh)$_{12}$Te$_9$(PEt$_3$)$_{12}$]; [Ag$_{30}$Se$_8$(Se$^t$Bu)$_{14}$(PnPr$_3$)$_8$]; [Co4(μ$_3$-Se)$_4$(PPh$_3$)$_4$]; [Co$_6$(μ$_3$-Se)$_8$(PPh$_3$)$_6$]; [W$_3$Se$_4$ (dmpe)$_3$Br$_3$]$^+$; Ru$_4$Bi$_2$(CO)$_{12}$; Fe$_4$P$_2$(CO)$_{12}$; Fe$_4$N$_2$(CO)$_{12}$ M Source For a compound semiconductor nanoparticle consisting of elements (ME)$_n$L$_m$ a source for element M is further added to the reaction and can consist of any M-containing species that has the ability to provide the growing particles with a source of M ions. The precursor can consist of but are not restricted to an organometallic compound, an inorganic salt, a coordination compound or the element.

Examples for II-VI, III-V, III-VI or IV-V for the first element include but are not restricted to:—

Organometallic such as but not restricted to a MR$_2$ where M=Mg R=alkyl or aryl group (Mg$^t$Bu$_2$); MR$_2$ where M=Zn, Cd, Te; R=alkyl or aryl group (Me$_2$Zn, Et$_2$Zn Me$_2$Cd, Et$_2$Cd); MR$_3$ Where M=Ga, In, Al, B; R=alkyl or aryl group [AlR$_3$, GaR$_3$, InR$_3$ (R=Me, Et, $^i$Pr)].

Coordination compound such as a carbonate but not restricted to a MCO$_3$ M=Ca, Sr, Ba, [magnesium carbonate hydroxide [(MgCO$_3$)$_4$ Mg(OH)$_2$]; M(CO$_3$)$_2$ M=Zn, Cd; MCO$_3$ M=Pb: acetate: M(CH$_3$CO$_2$)$_2$ M=Mg, Ca, Sr, Ba; Zn, Cd, Hg; M(CH$_3$CO$_2$)$_3$ M=B, Al, Ga, In: a β-diketonate or derivative thereof, such as acetylacetonate (2,4-pentanedionate) M[CH$_3$COCH═C(O$^-$)CH$_3$]$_2$ M=Mg, Ca, Sr, Ba, Zn, Cd, Hg; M[CH$_3$COCH═C(O$^-$)CH$_3$]$_3$ M=B, Al, Ga, In. Oxalate SrC$_2$O$_4$, CaC$_2$O$_4$, BaC$_2$O$_4$, SnC$_2$O$_4$. Hydroxide M(OH)$_2$ M=Mg, Ca, Sr, Ba, Zn, Cd, Hg, e.g. Cd(OH)$_2$. Sterate M(C$_{17}$H$_{35}$COO)$_2$ M=Mg, Ca, Sr, Ba, Zn, Cd, Hg.

Inorganic salt such as but not restricted to a Oxides SrO, ZnO, CdO, In$_2$O$_3$, Ga$_2$O$_3$, SnO$_2$, PbO$_2$; Nitrates Mg(NO$_3$)$_2$, Ca(NO$_3$)$_2$, Sr(NO$_3$)$_2$, Ba(NO$_3$)$_2$, Cd(NO$_3$)$_2$, Zn(NO$_3$)$_2$, Hg(NO$_3$)$_2$, Al(NO$_3$)$_3$, In(NO$_3$)$_3$, Ga(NO$_3$)$_3$, Sn(NO$_3$)$_4$, Pb(NO$_3$)$_2$ An element Mg, Ca, Sr, Ba, Zn, Cd, Hg, B, Al, Ga, In, Sn, Pb.

E Source

For a compound semiconductor nanoparticle consisting of elements (ME)$_n$L$_m$ a source for element E is further added to the reaction and can consist of any E-containing spices that has the ability to provide the growing particles with a source of E ions. The precursor can consist of but are not restricted to an organometallic compound, an inorganic salt, a coordination compound or an elemental source. Examples for an II-VI, III-V, III-VI or IV-V semiconductor were the second element include but are not restricted to:—

Organometallic such as but not restricted to a NR$_3$, PR$_3$, AsR$_3$, SbR$_3$ (R=Me, Et, $^t$Bu, $^i$Bu, Pr$^i$, Ph etc.); NHR$_2$, PHR$_2$, AsHR$_2$, SbHR$_2$ (R=Me, Et, $^t$Bu, $^i$Bu, Pr$^i$, Ph etc.); NH$_2$R, PH$_2$R, AsH$_2$R, SbH$_2$R$_3$ (R=Me, Et, $^t$Bu, $^i$Bu, Pr$^i$, Ph etc.); PH$_3$, AsH$_3$; M(NMe)$_3$ M=P, Sb, As; dimethyldrazine (Me$_2$NNH$_2$); ethylazide (Et-NNN); hydrazine (H$_2$NNH$_2$); Me$_3$SiN$_3$.

MR$_2$ (M=S, Se Te; R=Me, Et, $^t$Bu, $^i$Bu etc.); HMR (M=S, Se Te; R=Me, Et, $^t$Bu, $^i$Bu, $^i$Pr, Ph etc); thiourea S=C(NH$_2$)$_2$; Se=C(NH$_2$)$_2$.

Sn(CH$_4$)$_4$, Sn(C$_4$H$_9$), Sn(CH$_3$)$_2$(OOCH$_3$)$_2$.

Coordination compound such as but not restricted to a carbonate, MCO$_3$ M=P, bismuth subcarbonate (BiO)$_2$CO$_3$; M(CO$_3$)$_2$; acetate M(CH$_3$CO$_2$)$_2$ M=S, Se, Te: M(CH$_3$CO$_2$)$_2$ M=Sn, Pb or M(CH$_3$CO$_2$)$_4$ M=Sn, Pb: a β-diketonate or derivative thereof, such as acetylacetonate (2,4-pentanedionate) [CH$_3$COCH=C(O$^-$)CH$_3$]$_3$M M=Bi; [CH$_3$COCH=C(O$^-$)CH$_3$]$_2$M M=S, Se, Te: [CH$_3$COCH=C(O$^-$)CH$_3$]$_2$M M=Sn, Pb: thiourea, selenourea (H$_2$NC(=Se)NH$_2$.

Inorganic salt such as but not restricted to Oxides P$_2$O$_3$, As$_2$O$_3$, Sb$_2$O$_3$, Sb$_2$O$_4$, Sb$_2$O$_5$, Bi$_2$O$_3$, SO$_2$, SeO$_2$, TeO$_2$, Sn$_2$O, PbO, PbO$_2$; Nitrates Bi(NO$_3$)$_3$, Sn(NO$_3$)$_4$, Pb(NO$_3$)$_2$ An element:—Sn, Ge, N, P, As, Sb, Bi, S, Se, Te, Sn, Pb.

Figure 2:
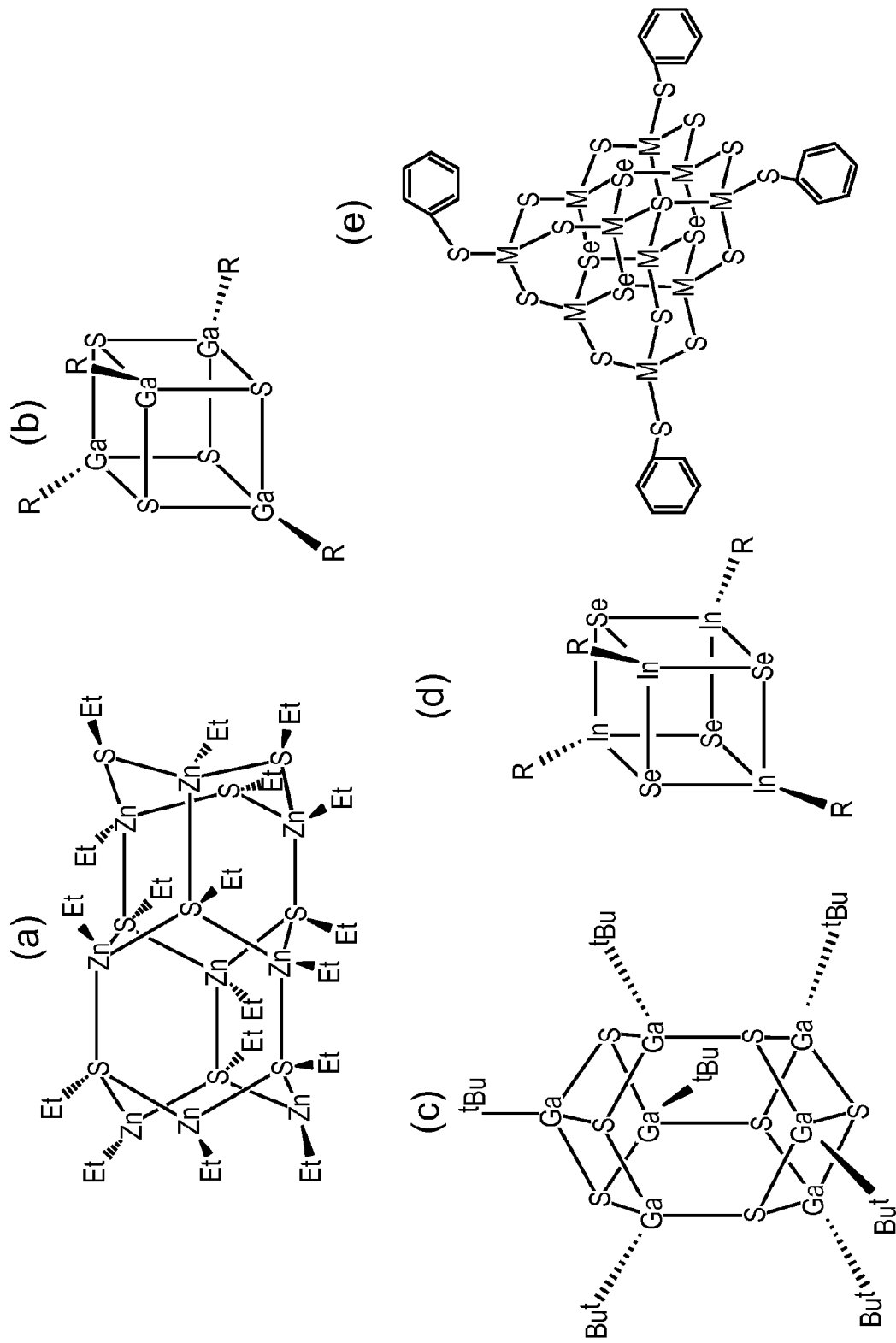
Figure 3A:
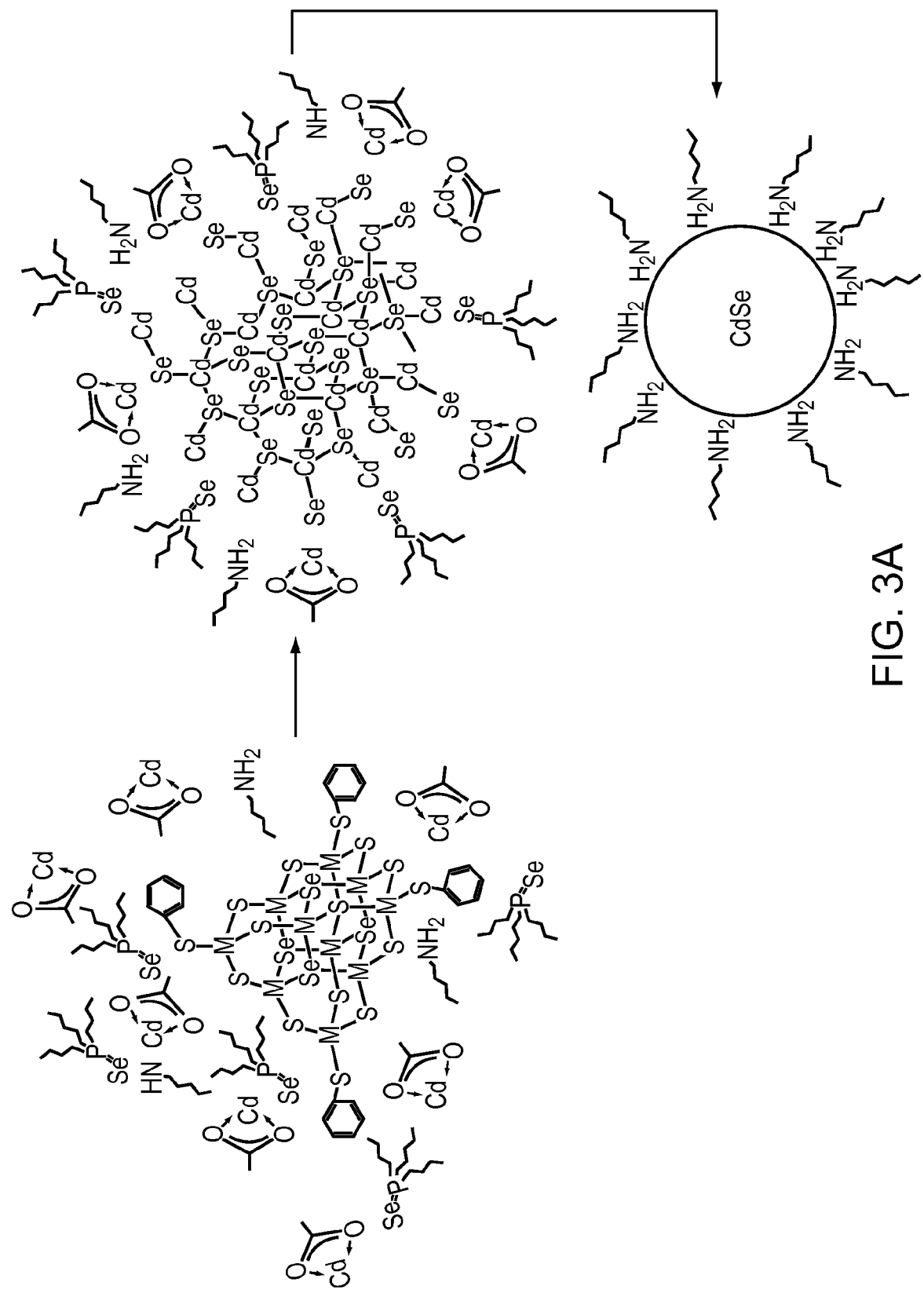
Figure 3B:
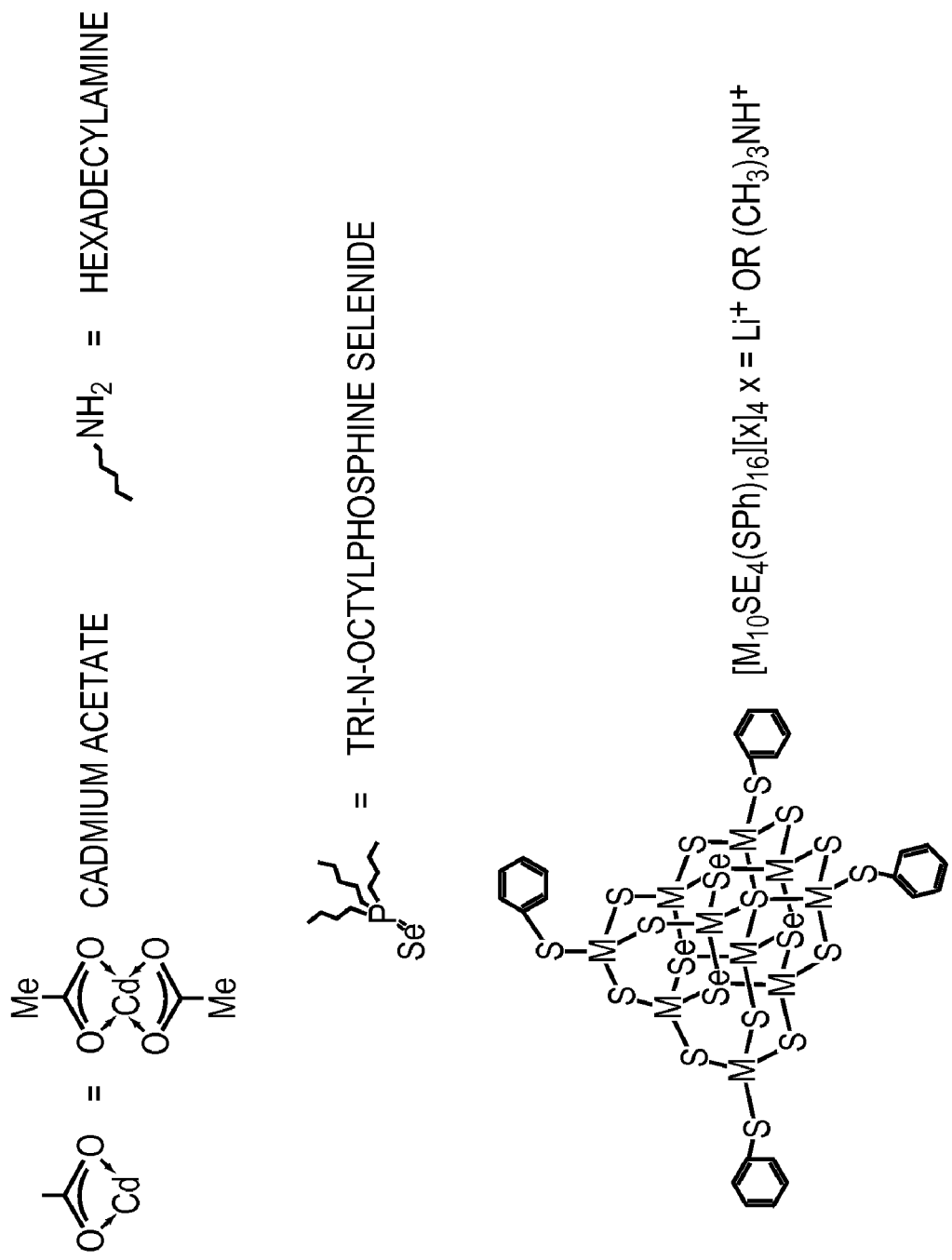
Figure 4A:
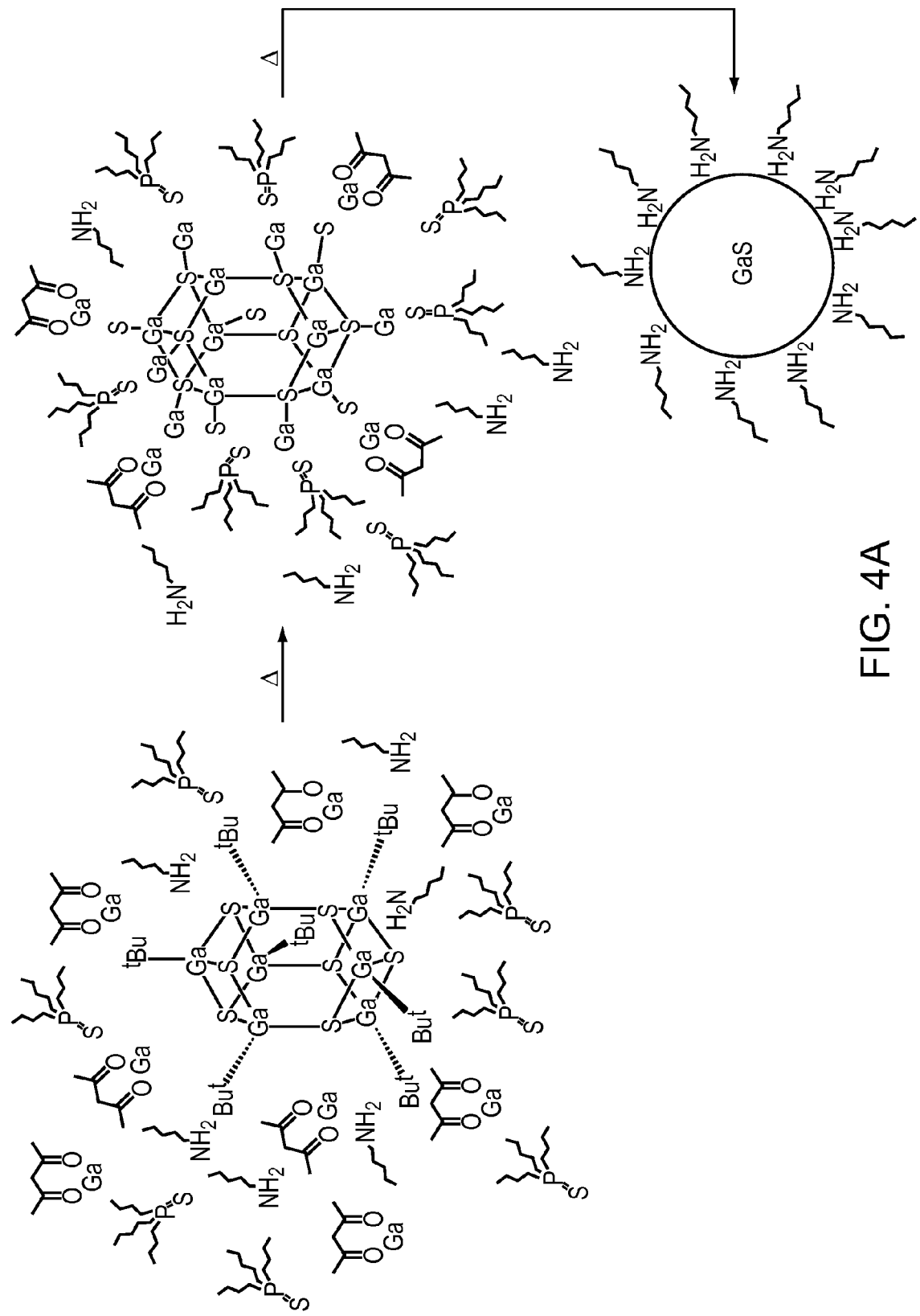
Figure 4B:
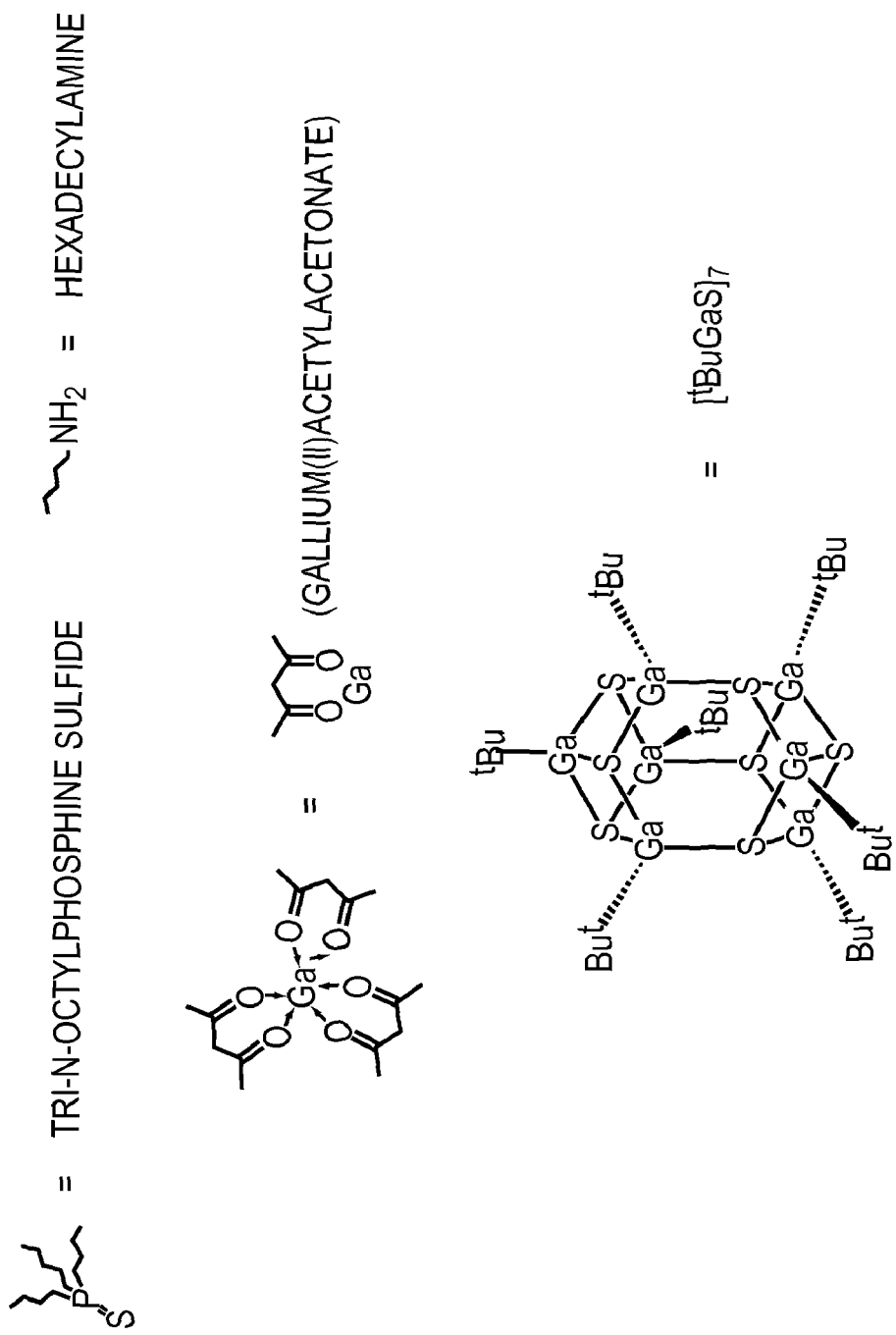
Figure 5A:
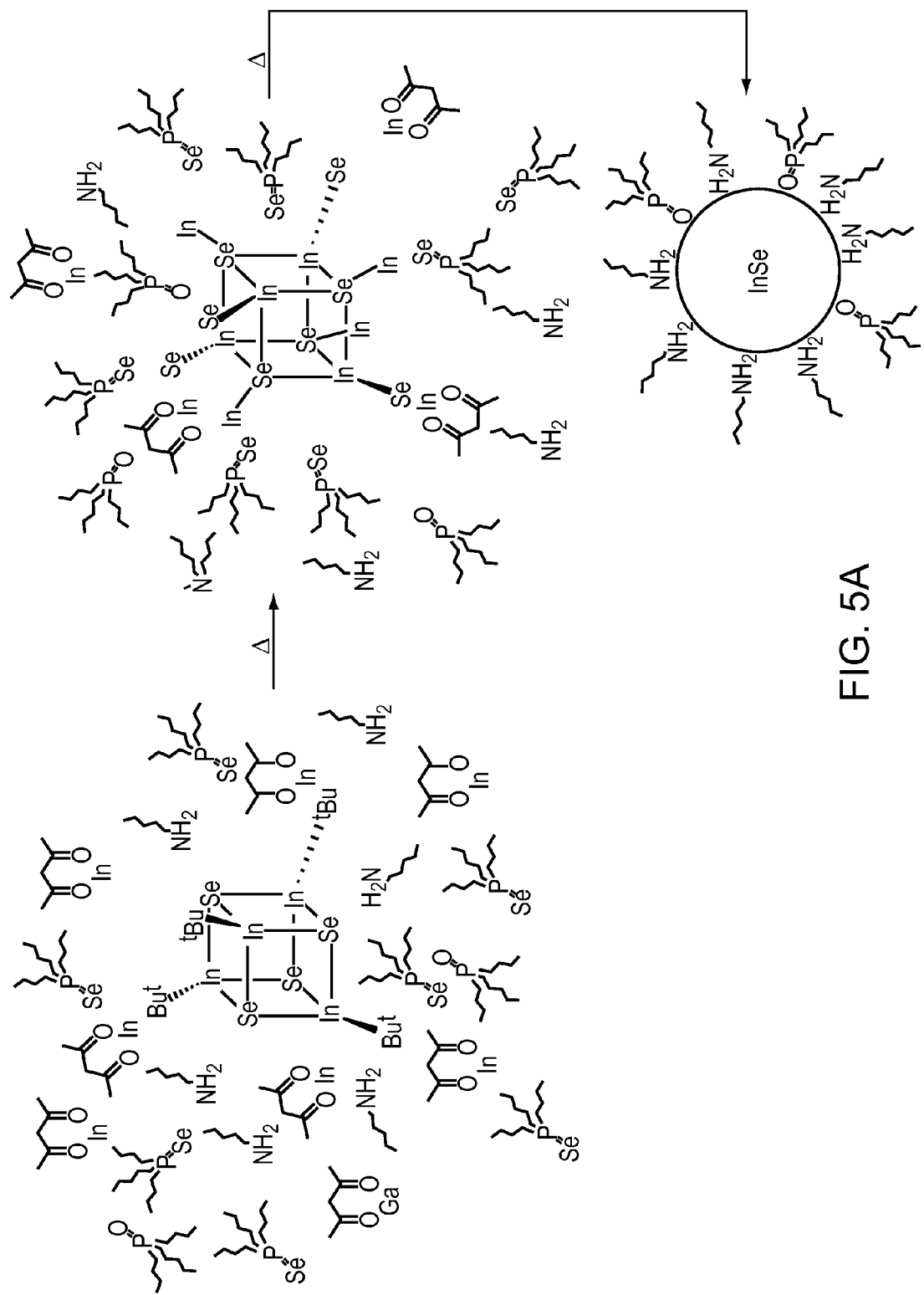
Figure 5B:
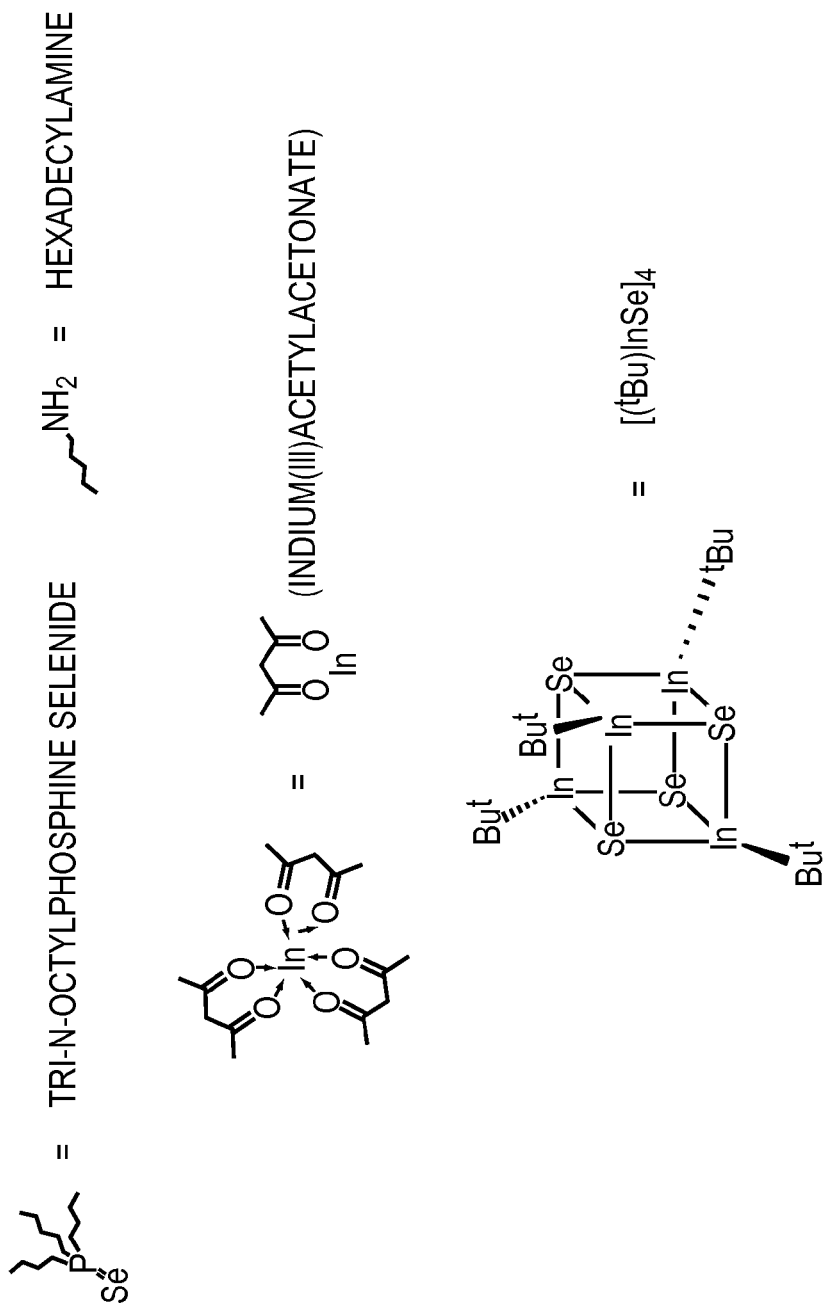
Figure 6A:
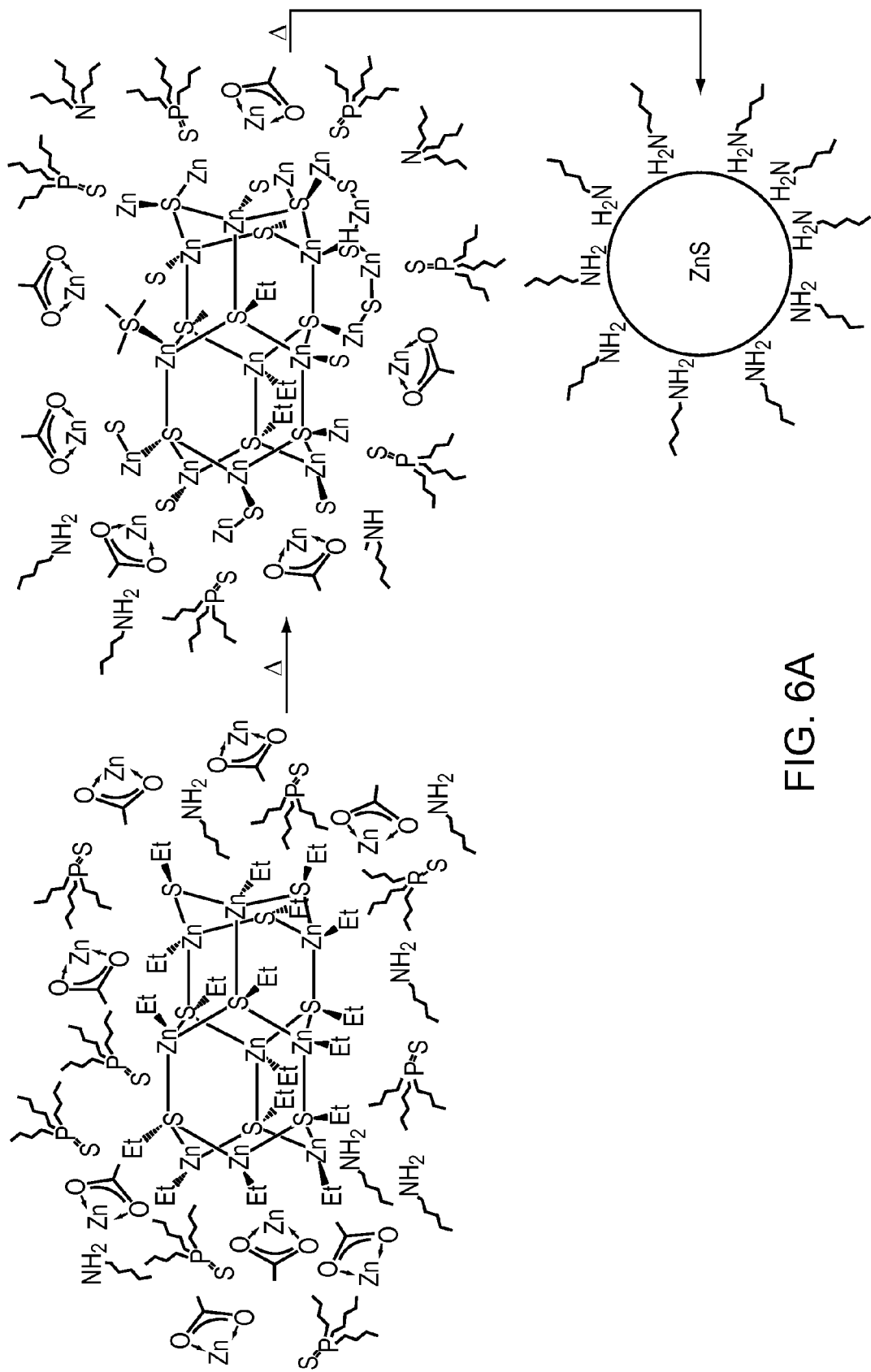
Figure 6B:
Figure 6B:
Figure 6B:
Figure 6B:
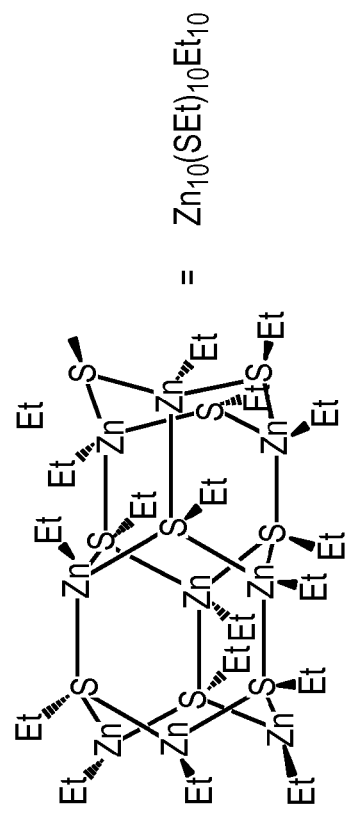
Figure 7:
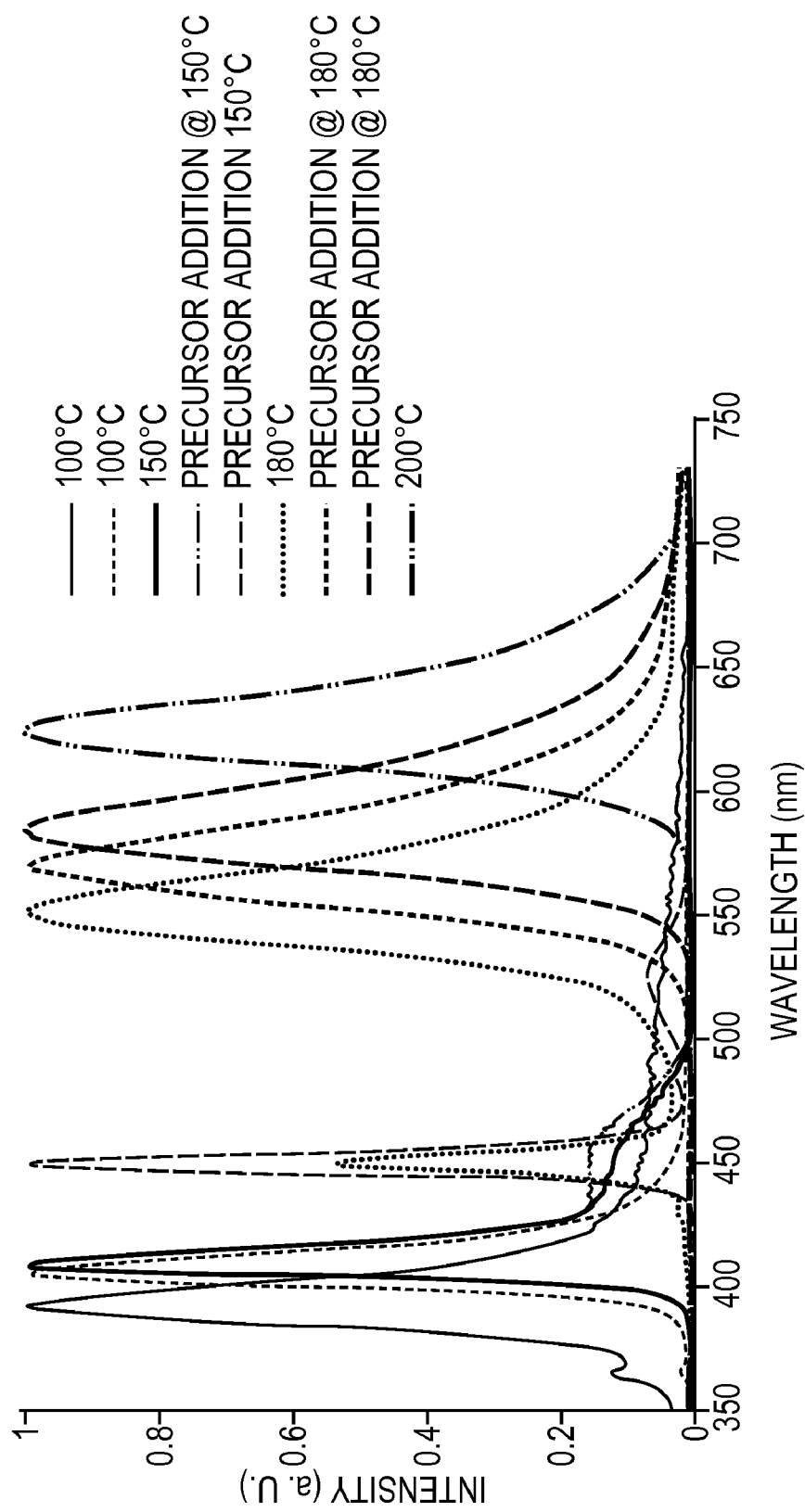
Figure 8:
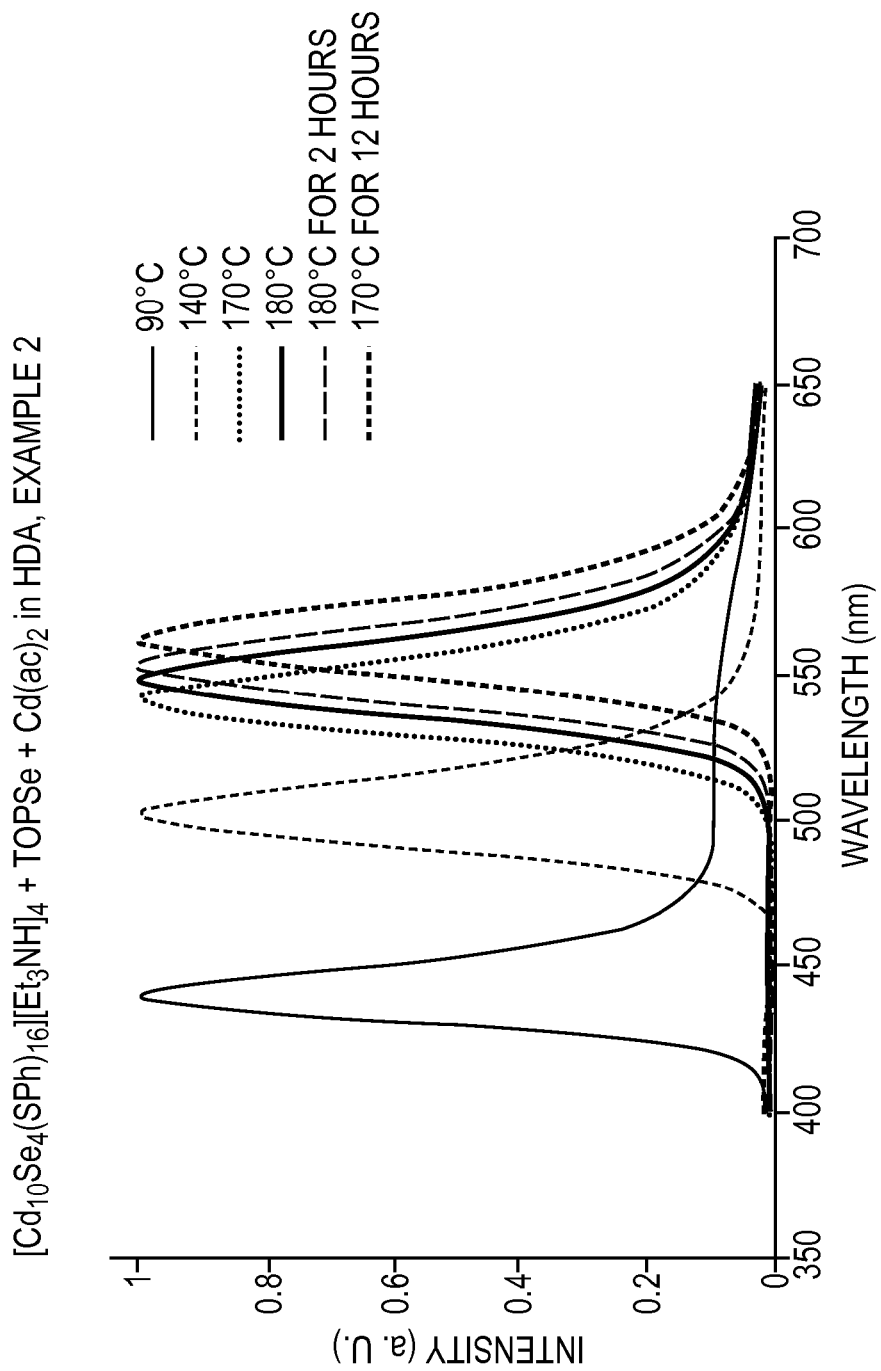
Figure 9:
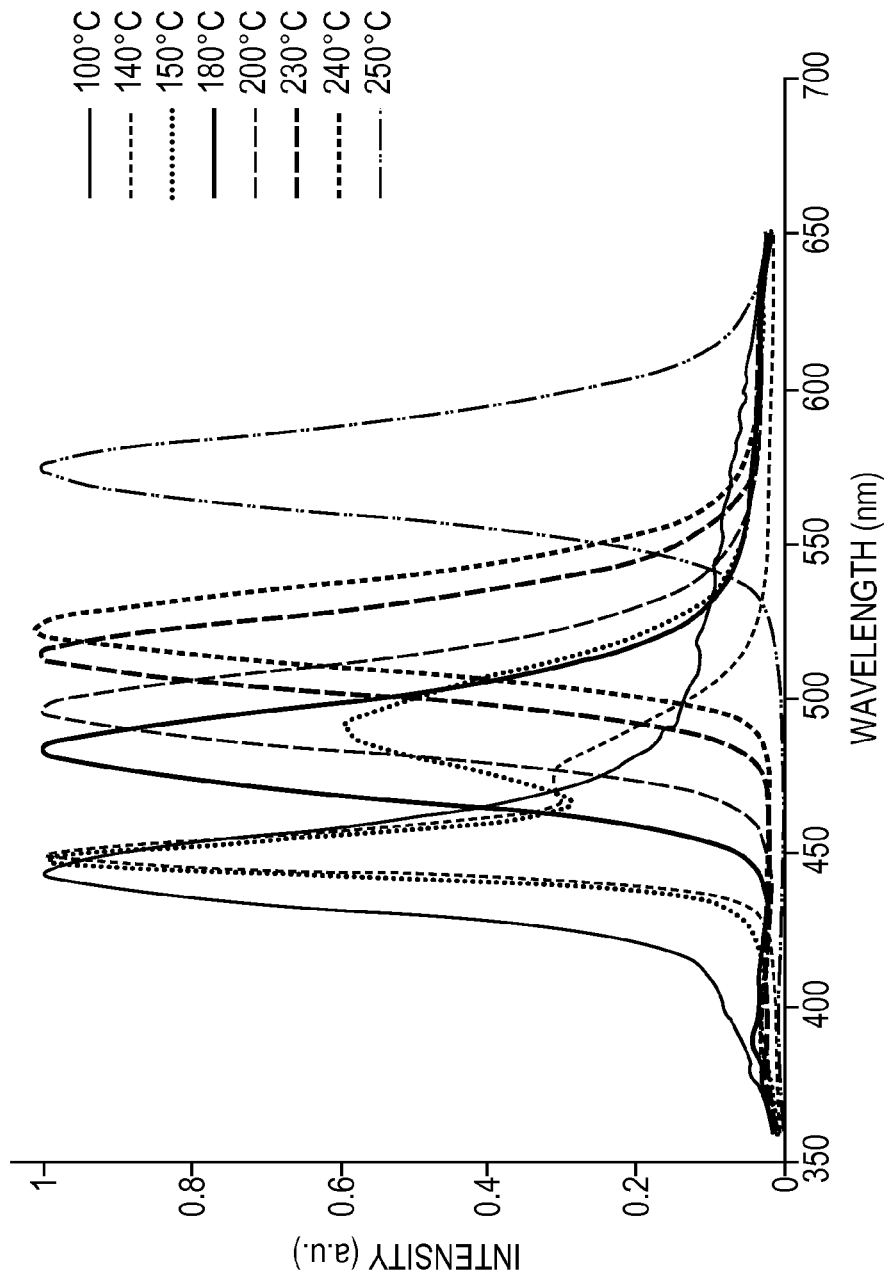
Figure 10:
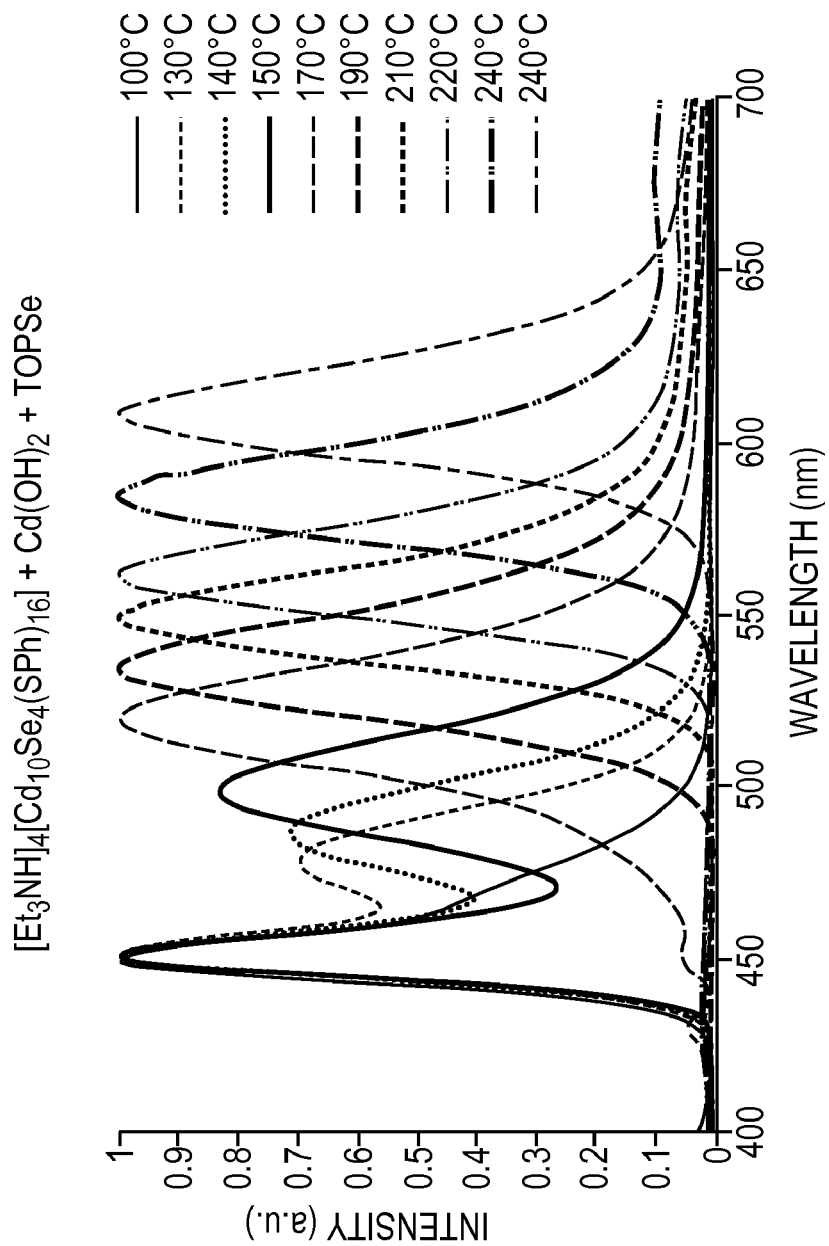
Figure 11:
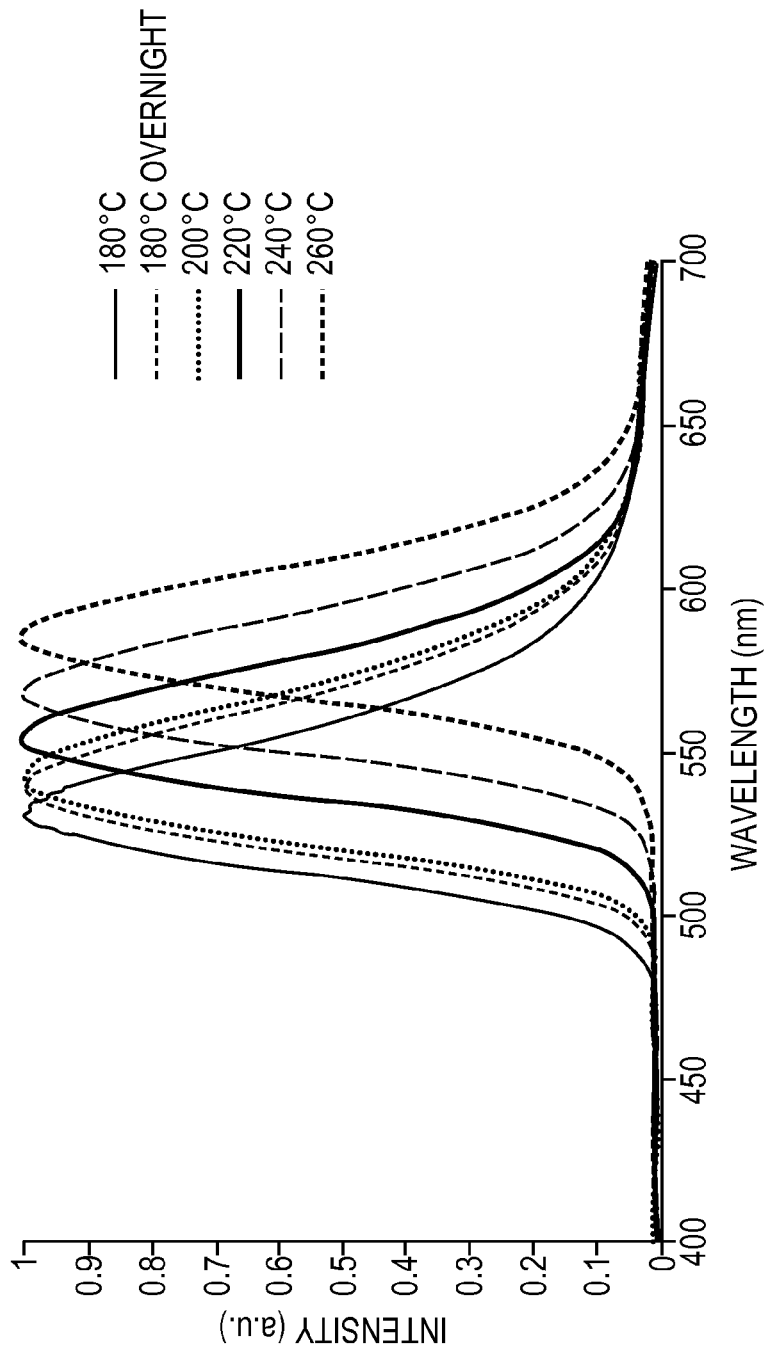
Figure 12:
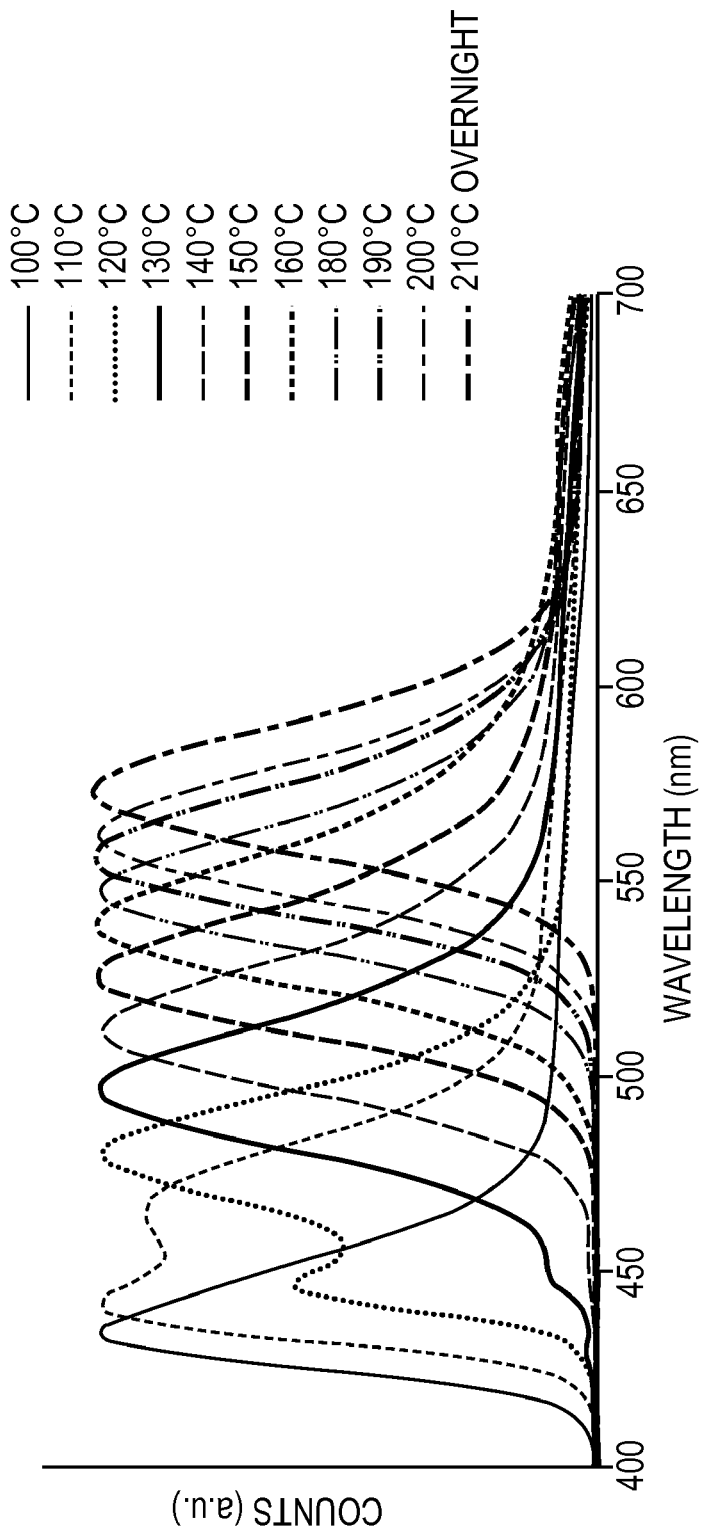
Figure 13:
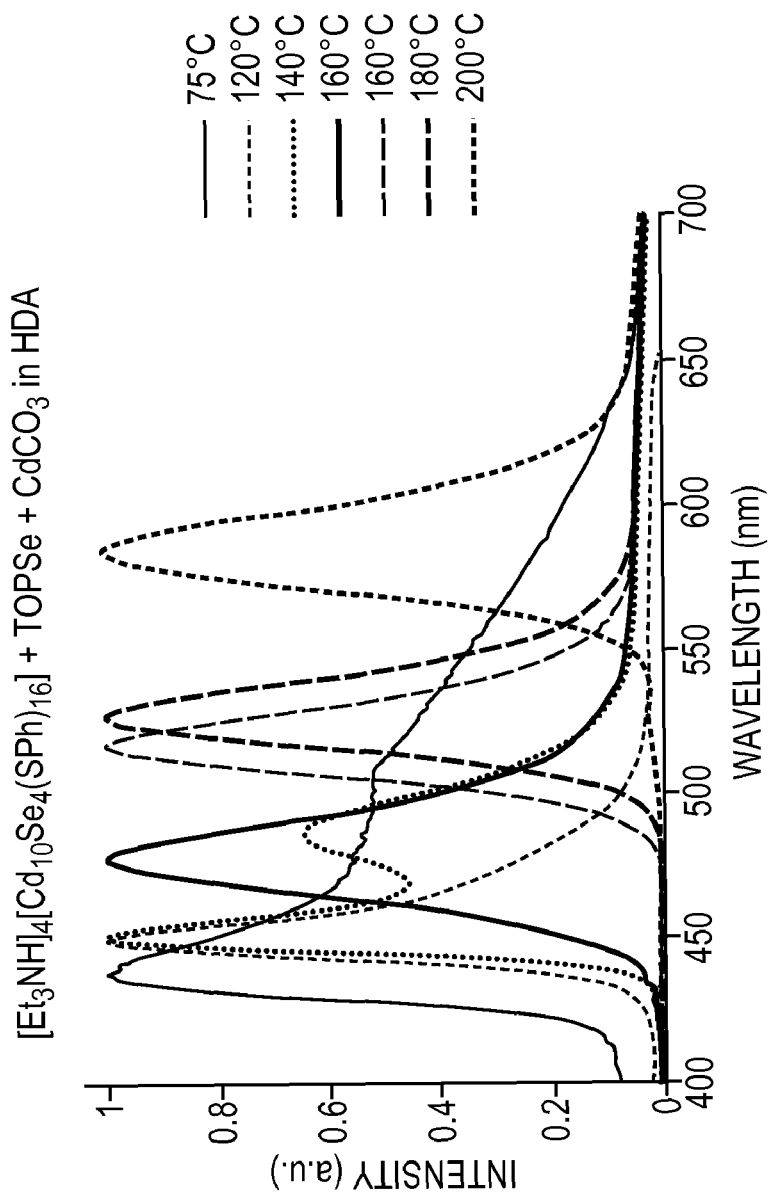
Figure 14:
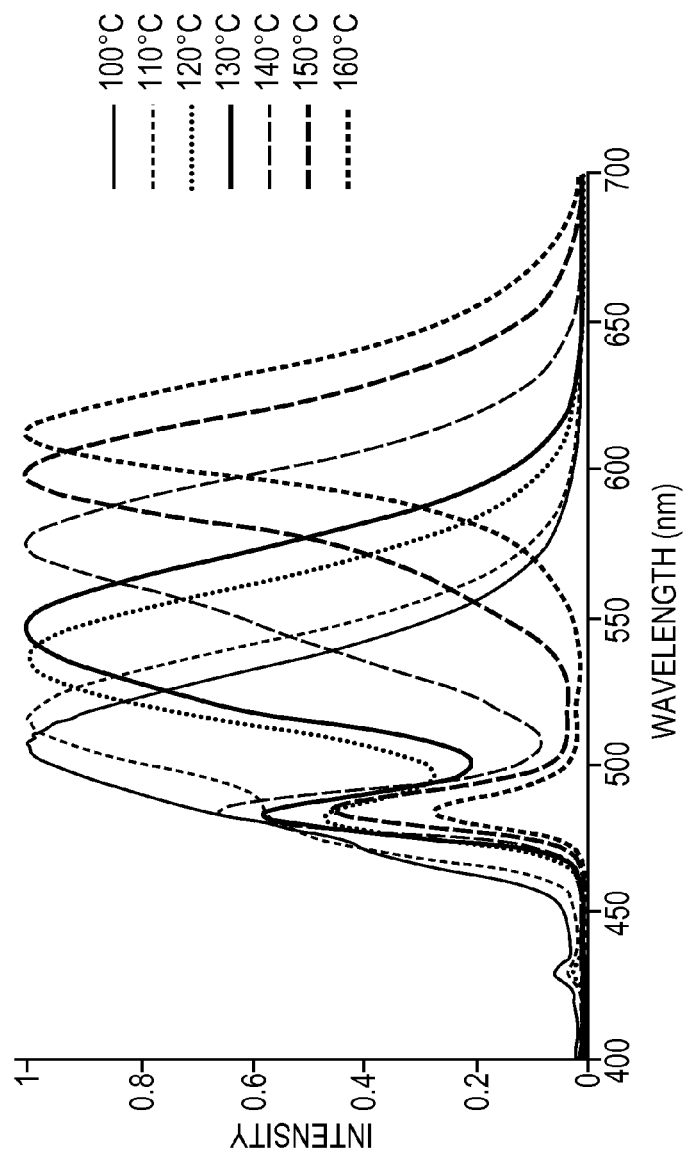

The present invention is illustrated with reference to the following non-limiting Examples and accompanying figures, in which:

FIG. 1) is a diagram of a) core particle consisting of a CdSe core and HDA as an organic capping agent, b) core-shell particle consisting of a CdSe core a ZnS shell and HDA as an organic capping agent, c) core-multi shell organic capped particle consisting of a CdSe core a HgS shell followed by a ZnS shell with a HDA capping agent;

FIG. 2) Molecular clusters used as seeding agents: a) Zn$_{10}$(Set)$_{10}$Et$_{10}$; b) [RGaS]$_4$; c) [Bu$^t$GaS]$_7$; d) [RInSe]$_4$; and e) [X]$_4$[M$_{10}$Se$_4$(SPh)$_{16}$] X=cation, M=Zn, Cd, Te;

FIGS. 3A and 3B) Formation of a Cadmium selenide quantum dot using [M$_{10Se4}$(SPh)$_{16}$][X]$_4$ X =Li$^+$ $^{or\ (CH_3)_3}$NH$^+$, Et$_3$NH$^+$ as the molecular seed and cadmium acetate and tri-n-octylphosphine selenide as the cadmium and selenium element-source precursors and with Hexadecylamine used as the capping agent;

FIGS. 4A and 4B) Formation of a Gallium sulfide quantum dot using [$^t$BuGaS]$_7$ as the molecular seed and gallium(II) acetylacetonate and tri-n-octylphosphine sulfide as the gallium and sulfide element-source precursors and with Hexadecylamine used as the capping agent;

FIGS. 5A and 5B) Formation of an indium selenide quantum dot using [($^t$Bu)InSe]$_4$ as the molecular seed and Indium (II)acetylacetonate and tri-n-octylphosphine sulfide as the Indium and selenide element-source precursors and with Hexadecylamine and tri-n-octylphosphine oxide used as the capping agent;

FIGS. 6A and 6B) Formation of a zinc sulfide quantum dot using Zn$_{10}$(SEt)$_{10}$Et$_{10}$ as the molecular seed and zinc acetate and tri-n-octylphosphine sulfide as the zinc and sulfur element-source precursors and with Hexadecylamine used as the capping agent;

FIG. 7) Evolution of the PL spectra of CdSe nanoparticles as the nanoparticles become bigger during growth. Preparation from [Et$_3$NH]$_4$[Cd$_{10}$Se$_4$(SPh)$_{16}$]/TOPSe/Cd(CH$_3$CO$_2$)$_2$ in HDA in accordance with Example 1;

FIG. 8) Evolution of the PL spectra of CdSe nanoparticles as the nanoparticles become bigger during growth. Preparation from [Et$_3$NH]$_4$[Cd$_{10}$Se$_4$(SPh)$_{16}$]/TOPSe/Cd(CH$_3$CO$_2$)$_2$ in HDA in accordance with Example 2;

FIG. 9) Evolution of the PL spectra of CdSe nanoparticles as the nanoparticles become bigger during growth. Preparation from [Et$_3$NH]$_4$[Cd$_{10}$Se$_4$(SPh)$_{16}$]/TOP/Se/CdO in HDA in accordance with Example 3;

FIG. 10) Evolution of the PL spectra of CdSe nanoparticles as the nanoparticles become bigger during growth. Preparation from [Et$_3$NH]$_4$[Cd$_{10}$Se$_4$(SPh)$_{16}$]/TOPSe/Cd(OH)$_2$ in HDA in accordance with Example 4;

FIG. 11) Evolution of the PL spectra of CdSe nanoparticles as the nanoparticles become bigger during growth. Preparation from [Et$_3$NH]$_4$[Cd$_{10}$Se$_4$(SPh)$_{16}$]/TOPSe/Me$_2$Cd in HDA in accordance with Example 5;

FIG. 12) Evolution of the PL spectra of CdSe nanoparticles as the nanoparticles become bigger during growth. Preparation from [Et$_3$NH]$_4$[Cd$_{10}$Se$_4$(SPh)$_{16}$]/TOPSe/(C$_{17}$H$_{35}$COO)$_2$Cd in HDA in accordance with Example 7;

FIG. 13) Evolution of the PL spectra of CdSe nanoparticles as the nanoparticles become bigger during growth. Preparation from [Et$_3$NH]$_4$[Cd$_{10}$Se$_4$(SPh)$_{16}$]/TOPSe/CdCO$_3$ in HDA in accordance with Example 8;

FIG. 14) Evolution of the PL spectra of CdTe nanoparticles as the nanoparticles become bigger during growth. Preparation from [Et$_3$NH]$_4$[Cd$_{10}$Se$_4$(SPh)$_{16}$]/Te as a slurry in TOP/Cd(CH$_3$CO$_2$)$_2$ in HDA in accordance with Example 9.

EXAMPLES

All syntheses and manipulations were carried out under a dry oxygen-free argon or nitrogen atmosphere using standard Schlenk or glove box techniques. All solvents were distilled from appropriate drying agents prior to use (Na/K-benzophenone for THF, Et$_2$O, toluene, hexanes and pentane). HDA, octylamine, TOP, Cd(CH$_3$CO$_2$)$_2$, selenium powder, CdO, CdCO$_3$ (Adrich) were procured commercially and used without further purification.

UV-vis absorption spectra were measured on a Heλiosβ Thermospectronic. Photoluminescence (PL) spectra were measured with a Fluorolog-3 (FL3-22) photospectrometer at the excitation wavelength 380 nm. Powder X-Ray diffraction (PXRD) measurements were preformed on a Bruker AXS D8 diffractometer using monochromated Cu-K$_\alpha$ radiation.

For all methods all capping agent solutions were dried and degassed before use by heating the mixture to 120° C. under a dynamic vacuum for at lest 1 hour. The reaction mixture was then cooled to the desired temperature for that particular reaction before any seeding agent or growth precursors were added to the solution.

Cluster Preparation

Preparation of [HNEt$_3$]$_2$[Cd$_4$(SPh)$_{10}$]

To a stirred methanol (60 ml) solution of benzenethiol (20.00 g, 182 mmol) and triethylamine (18.50 g, 182 mmoL) was added dropwise Cd(NO$_3$)$_2$4H$_2$O (21.00 g, 68.00 mmol) that had previously been dissolved in methanol (60 mL). The solution was then allowed to stir while warming until the precipitate had completely dissolved to leave a clear solution. This was then place at 5° C. for 24 h in which time large colourless crystals of $[HNEt_3]_2[Cd_4(SPh)_{10}]$ had formed. FW=1745.85. Anal. Calcu for $C_{72}H_{82}N_2S_{10}Cd_4$ C=49.53, H=4.70, N=1.61, S=18.37, Cd=25.75%; Found C=49.73, H=4.88, N=1.59, S=17.92%

Preparation of $[HNEt_3]_4[Cd_{10}Se_4(SPh)_{16}]$

This was by a similar procedure to that described by Dance et al[36].

To a stirred acetonitrile (100 ml) solution of $[HNEt_3]_2[Cd_4(SPh)_{10}]$ (80.00 g, 45.58 mmol) was added 3.57 g 45.21 mmol of selenium powder, the resulting slurry was left to stir for 12 hours, this produced a white precipitate. A further 750 ml of acetonitrile was added and the solution warmed to 75° C. to give a clear pale yellow solution which was allowed to cool to 5° C., yielding large colourless crystals. The crystals were washed in hexane and recrystallized from hot acetonitrile. To give 22.50 g of $[HNEt_3]_4[Cd_{10}Se_4(Ph)_{16}]$. FW=3595.19 Anal. Calc for $C_{120}H_{144}N_4Se_4S_{16}Cd_{10}$. C=40.08, H=4.00, N=1.56, S=14.27, Se=8.78, Cd=31.26%. Found C=40.04, H=4.03, N=1.48, S=14.22, Cd=31.20%.

Example 1

Preparation of CdSe Nanoparticles from $[Et_3NH]_4$ $[Cd_{10}Se_4(SPh)_{16}]$/TOPSe/Cd$(CH_3CO_2)_2$ in HDA HDA (300 g) was placed in a three-neck flask and dried/degassed by heating to 120° C. under a dynamic vacuum for 1 hour. The solution was then cooled to 70° C. To this was added 1.0 g of $[Et_3NH]_4[Cd_{10}Se_4(SPh)_{16}]$ (0.311 mmol), TOPSe (20 ml, 40.00 mmol) [previously prepared from dissolving selenium powder in TOP] and Cd$(CH_3CO_2)_2$ (10.66 g 40.00 mmol) the temperature of reaction mixture was gradually increased from 70° C. to 180° C. over an 8 hour period. The progressive formation/growth of the nanoparticles was monitored by their emission wavelength by taking aliquots from the reaction mixture and measuring their UV-vis and PL spectra. The reaction was stopped when the emission spectra had reached 572 nm by cooling the reaction to 60° C. followed by addition of 200 ml of dry "warm" ethanol which gave a precipitation of nanoparticles. The resulting CdSe were dried before re-dissolving in toluene filtering through Celite followed by re-precipitation from warm ethanol to remove any excess HDA and Cd$(CH_3CO_2)_2$. This produced 9.26 g of HDA capped CdSe nanoparticles.

Example 2

Preparation of CdSe Nanoparticles from $[Et_3NH]_4$ $[Cd_{10}Se_4(SPh)_{16}]$/TOPSe/Cd$(CH_3CO_2)_2$ in HDA HDA (250 g) and octylamine (20 g) was placed in a three-neck flask and dried/degassed by heating to 120° C. under a dynamic vacuum for 1 hour. The solution was then cooled to 70° C. To this was added 1.0 g of $[Et_3NH]_4[Cd_{10}Se_4(SPh)_{16}]$ (0.311 mmol), TOPSe (1M, 4 ml, 4.00 mmol) [previously prepared from dissolving selenium powder in TOP] and Cd$(CH_3CO_2)_2$ dissolved in TOP (0.5M, 4 ml, 2.00 mmol) the temperature of reaction mixture was gradually increased from 70° C. to 150° C. over a hour period. A further 17 ml (17.00 mmol) of TOPSe and 27 ml of a 0.5M Cd$(CH_3CO_2)_2$ dissolved in TOP (13.50 mmol) were added dropwise while the temperature was gradually increased to 200° C. over a 24 h period. The progressive formation/growth of the nanoparticles was monitored by their emission wavelength by taking aliquots from the reaction mixture and measuring their UV-vis and PL spectra. The reaction was stopped when the emission spectra had reached the desired size 630 nm by cooling the reaction to 60° C. followed by addition of 200 ml of dry "warm" ethanol which gave a precipitation of particles. The resulting CdSe were dried before re-dissolving in toluene filtering through Celite followed by re-precipitation from warm ethanol to remove any excess HDA. This produced 4.56 g of HDA capped CdSe nanoparticles.

Example 3

Preparation of CdSe Nanoparticles from $[Et_3NH]_4$ $[Cd_{10}Se_4(SPh)_{16}]$/TOP/Se/CdO in HDA HDA (150 g) and t-decylphosphonic acid (0.75 g) was placed in a three-neck flask and dried and degassed by heating to 120° C. under a dynamic vacuum for 1 hour. The solution was then cooled to 80° C. To this was added 0.5 g of $[Et_3NH]_4[Cd_{10}Se_4(SPh)_{16}]$ (0.156 mmol), 20 ml of TOP, 0.6 g of selenium powder (7.599 mmol) and 0.8 g CdO (6.231 mmol) the reaction mixture was allowed to stir to give a pale red cloudy mixture. The temperature of the reaction mixture was gradually increased from 80° C. to 250° C. over a period of 24 h. The progressive formation/growth of the nanoparticles was followed by their emission wavelength by taking aliquots from the reaction mixture and measuring their UV-vis and PL spectra. The reaction was stopped when the emission spectra had reached the desired size (593 nm) by cooling the reaction to 60° C. followed by addition of 200 ml of dry "warm" ethanol, which gave a precipitation of particles. The resulting CdSe were dried before re-dissolving in toluene filtering through Celite followed by re-precipitation from warm ethanol to remove any excess HDA. This produced 1.55 g of HDA capped CdSe nanoparticles.

Example 4

Preparation of CdSe Nanoparticles from $[Et_3NH]_4$ $[Cd_{10}Se_4(SPh)_{16}]$/TOPSe/Cd$(HO)_2$ in HDA HDA (400 g) was placed in a three-neck flask and dried and degassed by heating to 120° C. under a dynamic vacuum for 1 hour. The solution was then cooled to 70° C. To this was added 1.00 g of $[Et_3NH]_4[Cd_{10}Se_4(SPh)_{16}]$ (0.278 mmol), 20.0 ml of TOPSe, (2M solution) and 5.85 g of Cd$(OH)_2$ (40.00 mmol), the reaction mixture was allowed to stir to give a pale yellow cloudy mixture. The temperature of the reaction mixture was gradually increased from 70° C. to 240° C. over a period of 24 h. The progressive formation/growth of the nanoparticles was followed by their emission wavelength by taking aliquots from the reaction mixture and measuring their UV-vis and PL spectra. The reaction was stopped when the emission spectra had reached the desired size (609 nm) by cooling the reaction to 60° C. followed by addition of 200 ml of dry "warm" ethanol, which gave a precipitation of particles. The resulting CdSe were dried before re-dissolving in toluene filtering through Celite followed by re-precipitation from warm ethanol to remove any excess HDA. This produced 10.18 g of HDA capped CdSe nanoparticles.

Example 5

Preparation of CdSe Nanoparticles from $[Et_3NH]_4$ $[Cd_{10}Se_4(SPh)_{16}]$/TOPSe/Me$_2$Cd in HDA HDA (100 g) was placed in a three-neck flask and dried and degassed by heating to 120° C. under a dynamic vacuum for 1 hour. The solution was then cooled to 70° C. To this was added 0.13 g of $[Et_3NH]_4[Cd_{10}Se_4(SPh)_{16}]$ (0.036 mmol), 2.5 ml of TOPSe, (2M solution) and 0.71 g $Me_2Cd$ [that had previously been dissolved in TOP] (0.358 ml, 5.00 mmol) the reaction mixture was allowed to stir. The temperature of the reaction mixture was gradually increased from 80° C. to 260° C. over a period of 24 h. The progressive formation/growth of the nanoparticles was followed by their emission wavelength by taking aliquots from the reaction mixture and measuring their UV-Vis and PL spectra. The reaction was stopped when the emission spectra had reached the desired size (587 nm) by cooling the reaction to 60° C. followed by addition of 100 ml of dry "warm" ethanol, which gave a precipitation of particles. The resulting CdSe were dried before re-dissolving in toluene filtering through Celite followed by re-precipitation from warm ethanol to remove any excess HDA. This produced 1.52 g of HDA capped CdSe nanoparticles.

Example 6

Preparation of CdSe Nanoparticles from $[Et_3NH]_4[Cd_{10}Se_4(SPh)_{16}]$/TOPSe/$Me_2Cd$ in HDA HDA (100 g) was placed in a three-neck flask and dried and degassed by heating to 120° C. under a dynamic vacuum for 1 hour. The solution was then cooled to 70° C. To this was added 0.13 g of $[Et_3NH]_4[Cd_{10}Se_4(SPh)_{16}]$ (0.036 mmol). The temperature was then increased to 100° C. and maintained at this temperature while 2.5 ml of TOPSe, (2M solution) and 0.71 g $Me_2Cd$ [that had previously been dissolved in TOP] (0.358 ml, 5.00 mmol) were added dropwise over a 4 hour period. The progressive formation/growth of the nanoparticles was followed by their emission wavelength by taking aliquots from the reaction mixture and measuring their UV-Vis and PL spectra. The reaction was stopped when the emission spectra had reached the desired size (500 nm) by cooling the reaction to 60° C. followed by addition of 100 ml of dry "warm" ethanol, which gave a precipitation of particles. The resulting CdSe were dried before re-dissolving in toluene filtering through Celite followed by re-precipitation from warm ethanol to remove any excess HDA. This produced 1.26 g of HDA capped CdSe nanoparticles.

Example 7

Preparation of CdSe Nanoparticles from $[Et_3NH]_4[Cd_{10}Se_4(SPh)_{16}]$/TOPSe/$(C_{17}H_{35}COO)_2Cd$ in HDA HDA (200 g) was placed in a three-neck flask and dried and degassed by heating to 120° C. under a dynamic vacuum for 1 hour. The solution was then cooled to 80° C. To this was added 0.5 g of $[Et_3NH]_4[Cd_{10}Se_4(SPh)_{16}]$ (0.139 mmol), 20 ml of TOPSe (2M solution) and a solution of 2.568 g CdO (20 mmol) previously dissolved in steric acid (23.00 g), the reaction mixture was allowed to stir to give a pale yellow clear solution. The temperature of the reaction mixture was gradually increased from 70° C. to 220° C. over a period of 24 h. The progressive formation/growth of the nanoparticles was followed by their emission wavelength by taking aliquots from the reaction mixture and measuring their UV-vis and PL spectra. The reaction was stopped when the emission spectra had reached the desired size (590 nm) by cooling the reaction to 60° C. followed by addition of 400 ml of dry "warm" ethanol, which gave a precipitation of particles. The resulting CdSe were dried before re-dissolving in toluene filtering through Celite followed by re-precipitation from warm ethanol to remove any excess HDA. This produced 4.27 g of HDA capped CdSe nanoparticles.

Example 8

Preparation of CdSe Nanoparticles from $[Et_3NH]_4[Cd_{10}Se_4(SPh)_{16}]$/TOPSe/$CdCO_3$ in HDA HDA (50 g) was placed in a three-neck flask and dried/degassed by heating to 120° C. under a dynamic vacuum for 1 hour. The solution was then cooled to 75° C. To this was added 0.5 g of $[Et_3NH]_4[Cd_{10}Se_4(SPh)_{16}]$ (0.156 mmol), TOPSe (1.0M, 5 ml, 5.00 mmol) [previously prepared from dissolving selenium powder in TOP] and $CdCO_3$ dissolved in TOP (0.5M, 5 ml, 2.50 mmol) the temperature of reaction mixture was gradually increased from 70° C. to 200° C. over a 48 h period. The progressive formation/growth of the nanoparticles were monitored by their emission wavelength by taking aliquots from the reaction mixture and measuring their UV-vis and PL spectra. The reaction was stopped when the emission spectra had reached the desired size (587 nm) by cooling the reaction to 60° C. followed by addition of 200 ml of dry "warm" ethanol which gave a precipitation of particles. The resulting CdSe were dried before re-dissolving in toluene filtering through Celite followed by re-precipitation from warm ethanol to remove any excess HDA. This produced 0.95 g of HDA capped CdSe nanoparticles.

Example 9

Preparation of CdTe Nanoparticles from $[Et_3NH]_4[Cd_{10}Se_4(SPh)_{16}]$/TOPTe/$Cd(CH_3CO_2)_2$ in HDA HDA (200 g) was placed in a three-neck flask and dried/degassed by heating to 120° C. under a dynamic vacuum for 1 hour. The solution was then cooled to 70° C. To this was added 1.0 g of $[Et_3NH]_4[Cd_{10}Se_4(SPh)_{16}]$ (0.311 mmol), a brown slurry of TOP (20 ml) with tellurium (2.55 g, 20.00 mmol) along with $Cd(CH_3CO_2)_2$ (4.33 g, 20.00 mmol) was added. The temperature of reaction mixture was gradually increased from 70° C. to 160° C. over an 8 hour period. The progressive formation/growth on the CdTe nanoparticles was monitored by their emission wavelengths by taking aliquots from the reaction mixture and measuring their UV-vis and PL spectra. The reaction was stopped when the emission spectra had reached (624 nm) by cooling the reaction to 60° C. followed by addition of 200 ml of dry "warm" ethanol which gave a precipitation of particles. The resulting CdTe were dried before recrystallizing from toluene followed by re-precipitation from warm ethanol to remove any excess HDA. This produced 6.92 g of HDA capped CdTe nanoparticles.

REFERENCES

1 Henglein, A. *Chem. Rev.* 1989, 89, 1861.
2 Steigerwald, M. L.; Brus, L. E. *Acc. Chem. Res.* 1990, 23, 183.
3 Bawendi, M. G.; Steigerwald, M. L.; Brus, L. E. *Annu. Rev. Phys. Chem.*, 1990, 41, 477.
4 Weller, H. *Angew. Chem. Int. Ed. Engl.* 1993, 32, 41.
5 Weller, H. *Adv. Mater,* 1993, 5, 88.
6 Hagfeldt, A.; Gratzel, M. *Chem. Rev.* 1995, 95, 49.
7 Fendler, J. H.; Meldrum, F. C. *Adv. Mater.* 1995, 7, 607.
8 Alivisatos, A. P.; *J. Phys. Chem.* 1996, 100, 13226.
9 Stroscio, J. A.; Eigler, D. M. *Science* 1991, 254, 1319.
10 Lieber, C. M.; Liu, J.; Sheehan, P. *Angew. Chem. Int. Ed. Engl.* 1996, 35, 687.
11 Berry, C. R. *Phys. Rev.* 1967, 161, 848.
12 Matijevic, E. *Ann. Rev. Mater. Sci.* 1985, 15, 483.
13 Matijevic, E. *Langmuir* 1986, 2, 12.

14 A Eychmüller, A. Mews, and H. Weller, Chem. Phys. Lett. 208, p. 59 (1993).
15 Murray, C. B.; Norris, D. J.; Bawendi, M. G. *J. Am. Chem. Soc.* 1993, 115, 8706.
16 A. P. Alivisatos, J. Wickham, X. G. Peng, J. Am. Chem. Soc, 1998, 120, 5343.
17 X. G. Peng, L. Manna, W. D. Yang, J. Wickham, E. Scher, A. Kadavanich, A. P. Alivisatos, Nature 2000, 404, 59.
18 Peng, Z. A.; Peng, X. G. *J. Am. Chem. Soc.* 2001, 123, 1389.
19 a) Bunge, S. D.; Krueger, K. M.; Boyle, T. J.; Rodriguez, M. A.; Headley, T. J.; Colvin, V. L., J. Mater. Chem., 2003, 13, 1705: b) Aldana, J.; Wang, Y. A.; Peng, X. J. Am. Chem. Soc. 2001, 123, 8844.
20 Pradhan N.; Efrima S, *J. Am. Chem. Soc* 2003, 125, 2050; Qu, L.; Peng, Z. A.; Peng, X. Nano Lett. 2001, 1, 333.
21 Jegier, J. A.; McKernan, S.; Gladfelter, W. L. *Chem. Mater.,* 1998, 10, 2041.
22 Kher, S. S.; Wells, R. L. *Chem. Mater.,* 1994, 6, 2056.
23 Salata, O. V.; Dobson, P. J.; Hull, P. J.; Hutchison, J. L. *Appl. Phys. Letters* 1994, 65, 189.
24 Sercel, P. C.; Saunders, W. A.; Atwater, H. A.; Vahala, K. J.; Flagan, R. C. *Appl. Phys. Lett.,* 1992, 61, 696.
25 Olshaysky, M. A.; Goldstein, A. N.; Alivisatos, A, P. *J. Am. Chem. Soc.,* 1990, 112, 9438.
26 Guzelian, A. A.; Katari, J. E. B.; Kadavanich, A. V.; Banin, U.; Hamad, K.; Juban, E.; Alivisatos, A. P.; Wolters, R. H.; Arnold, C. C.; Heath, J. R. *J. Phys. Chem.,* 1996, 100, 7212.
27 Wells, R. L.; Aubuchon, S. R.; Kher, S. S.; Lube, M. S.; White, P. *Chem. Mater.,* 1995, 7, 793.
28 Agger, J. R.; Anderson, M. W.; Pemble, M. E.; Terasaki, O.; Nozue, Y. *J. Phys. Chem. B* 1998, 102, 3345.
29 Micic, O. I.; Sprague, J. R.; Curtis, C. J.; Jones, K. M.; Machol, J. L.; Nozic, A.; Giessen, J. H.; Fluegel, B.; Mohs, G.; Peyghambarian, N. *J. Phys. Chem.,* 1995, 99, 7754.
30 Guzelian, A. A.; Banin, U.; Kadavanich, A. V.; Peng, X.; Alivisatos, A. P. *Appl. Phys. Lett.,* 1996, 69, 1432.
31 Wang, Y.; Suna, Mahler, A. W.; Kasowski, R. *J. Chem. Phys.,* 1987, 87, 7315.
32 Gao, M.; Yang, Y.; Yang, B.; Bian, F.; Shen, J. *J. Chem. Soc. Commun.,* 1994, 2779.
33 Mekis, I.; Talapin, D. V.; Kornowski, A.; Haase, M.; Weller, H. *J. Phys. Chem. B.,* 2003, 107, 7454.
34 LØver, T.; Bowmaker, G. A.; Seakins, J. M.; Cooney, R. P.; Henderson, W. *J. Mater. Chem.,* 1997, 7(4), 647.
35 Cumberland, S. L.; Hanif, K. M.; Javier, A.; Khitov, K. A.; Strouse, G. F.; Woessner, S. M.; Yun, C. S. *Chem. Mater.* 2002, 14, 1576.
36 Dance, I. G.; Choy, A.; Scudder, M. L, *J. Am. Chem. Soc.,* 1984, 106, 6285.

The invention claimed is:

1. A method of producing nanoparticles, the method comprising:
    effecting conversion of a nanoparticle precursor composition to a material of the nanoparticles, said precursor composition comprising a first precursor species containing a first ion to be incorporated into the nanoparticles and a separate second precursor species containing a second ion to be incorporated into the nanoparticles, said conversion being effected in the presence of a molecular cluster compound different from the first precursor species and the second precursor species under conditions permitting seeding and growth of the nanoparticles,
    wherein a total amount of the nanoparticle precursor composition that is required to produce a desired final yield of the nanoparticles is added before growth of the nanoparticles has begun.
2. A method in accordance with claim 1, wherein a ratio of a number of moles of the cluster compound to a total number of moles of the first and second precursor species is selected from a range of 0.0001-0.1:1.
3. A method in accordance with claim 1, wherein a molar ratio of the first precursor species to the second precursor species is selected from a range of 100-1:1.
4. A method in accordance with claim 1, wherein the molecular cluster compound and nanoparticle precursor composition are dissolved in a solvent at a first temperature to form a solution and a temperature of the solution is then increased to a second temperature sufficient to initiate seeding and growth of the nanoparticles on the molecular clusters of said compound.
5. A method in accordance with claim 4, wherein the first temperature is selected from a range of 50° C. to 100° C.
6. A method in accordance with claim 4, wherein the second temperature is selected from a range of 120° C. to 280° C.
7. A method in accordance with claim 1, wherein the method comprises:
    a) monitoring an average size of the nanoparticles being grown; and
    b) terminating nanoparticle growth when the average nanoparticle size reaches a predetermined value.
8. A method in accordance with claim 7, wherein nanoparticle growth is terminated by reducing the temperature of the solution from the second temperature to a third temperature.
9. A method in accordance with claim 8, wherein the third temperature is selected from a range of 50° C. to 70° C.
10. A method in accordance with claim 1, wherein the first precursor species is selected from the group consisting of an organometallic compound, an inorganic salt, and a coordination compound.
11. A method in accordance with claim 1, wherein the second precursor species is selected from the group consisting of an organometallic compound, an inorganic salt, and a coordination compound.
12. A method in accordance with claim 1, wherein the molecular cluster compound comprises a third ion and a fourth ion to be incorporated into the nanoparticles.
13. A method in accordance with claim 12, wherein the third ion is selected from group 12, 13, 14, or 15 of the periodic table or from the transition metal group of the periodic table and further wherein:
    (i) if the third ion is selected from group 12 or 13 of the periodic table, then the fourth ion is selected from group 15 or 16 of the periodic table; and
    (ii) if the third ion is selected form group 14 of the periodic table, then the fourth ion is selected from group 16 of the periodic table; and
    (iii) if the third ion is selected from the transition metal group of the periodic table, then the fourth ion is selected form the d-block of the periodic table.
14. A method in accordance with claim 1, wherein the nanoparticles have cores comprising a core compound comprising fifth and sixth ions.
15. A method in accordance with claim 14, wherein each nanoparticle comprises at least one shell grown onto the nanoparticle core.
16. A method in accordance with claim 15, wherein the at least one shell has a lattice type similar to a lattice type of the nanoparticle core.

17. A method in accordance with claim 15, wherein the at least one shell has a wider band-gap than a band-gap of the nanoparticle core.

18. A method in accordance with claim 1, wherein the nanoparticles are ternary phase nanoparticles or quaternary phase nanoparticles.

19. A method in accordance with claim 1, wherein the nanoparticles comprise outer most layers comprising a capping agent.

20. A method in accordance with claim 19, wherein the capping agent is a solvent in which the nanoparticles are grown.

21. A method in accordance with claim 19, wherein the capping agent is a Lewis base.

22. A method of producing nanoparticles, the method comprising:

effecting conversion of a nanoparticle precursor composition to a material of the nanoparticles, said precursor composition comprising a first precursor species containing a first ion to be incorporated into the nanoparticles and a separate second precursor species containing a second ion to be incorporated into the nanoparticles, said conversion being effected in the presence of a molecular cluster compound different from the first precursor species and the second precursor species under conditions permitting seeding and growth of the nanoparticles, wherein a total amount of the nanoparticle precursor composition that is required to produce a desired final yield of the nanoparticles is added in stages, an initial amount of the nanoparticle precursor composition being added before growth of the nanoparticles has begun and one or more further amounts of the nanoparticle precursor composition being added during growth of the nanoparticles.

23. A method in accordance with claim 22, wherein the one or more further amounts are added in a batchwise manner.

24. A method in accordance with claim 22 wherein the one or more further amounts are added in a continuous manner.

* * * * *